(12) United States Patent
Lee

(10) Patent No.: US 11,330,217 B2
(45) Date of Patent: May 10, 2022

(54) IMAGE SENSING DEVICE INCLUDING DUAL CONVERSION GAIN TRANSISTOR

(71) Applicant: SK hynix Inc., Icheon-si (KR)

(72) Inventor: Won Jun Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/080,712

(22) Filed: Oct. 26, 2020

(65) Prior Publication Data

US 2021/0368127 A1 Nov. 25, 2021

(30) Foreign Application Priority Data

May 22, 2020 (KR) .................. 10-2020-0061776

(51) Int. Cl.
*H04N 5/3745* (2011.01)
*H04N 5/374* (2011.01)
*H04N 5/355* (2011.01)

(52) U.S. Cl.
CPC ....... *H04N 5/37457* (2013.01); *H04N 5/3559* (2013.01); *H04N 5/3742* (2013.01); *H04N 5/37452* (2013.01)

(58) Field of Classification Search
CPC ............. H04N 5/37457; H04N 5/3742; H04N 5/37452; H04N 5/3559
See application file for complete search history.

(56) References Cited

U.S. PATENT DOCUMENTS

| 9,888,198 | B2 | 2/2018 | Mauritzson et al. | |
|---|---|---|---|---|
| 2012/0113290 | A1* | 5/2012 | Nakata | H04N 5/37457 348/222.1 |
| 2015/0124129 | A1* | 5/2015 | Aoki | H04N 5/3742 348/280 |
| 2015/0350583 | A1* | 12/2015 | Mauritzson | H04N 5/374 250/208.1 |
| 2020/0119066 | A1* | 4/2020 | Yun | H01L 27/14641 |

FOREIGN PATENT DOCUMENTS

KR 10-2010-0051555 A 5/2010

\* cited by examiner

*Primary Examiner* — Quan Pham
(74) *Attorney, Agent, or Firm* — Perkins Coie LLP

(57) ABSTRACT

An image sensing device includes a Bayer pixel group configured include pixels that form a Bayer pattern and are arranged in a 2×2 matrix, a 4SUM pixel group configured to include pixels that correspond to the same colors and are arranged in a 2×2 matrix, a Bayer floating diffusion disposed at a center portion of the Bayer pixel group, a 4SUM floating diffusion (FD) region disposed at a center portion of the 4SUM pixel group, a sensing node, and a gain conversion transistor coupled between the sensing node and any one of the Bayer floating diffusion (FD) region and the 4SUM floating diffusion (FD) region.

22 Claims, 16 Drawing Sheets ly 22, 2020, the disclosure of which is incorporated herein
IMAGE SENSING DEVICE INCLUDING DUAL CONVERSION GAIN TRANSISTOR

CROSS-REFERENCE TO RELATED APPLICATION

This patent document claims the priority and benefits of Korean patent application No. 10-2020-0061776, filed on May 22, 2020, the disclosure of which is incorporated herein by reference in its entirety as part of the disclosure of this patent document.

TECHNICAL FIELD

The technology and implementations disclosed in this patent document generally relate to image sensing devices, and more particularly to CMOS image sensing devices.

BACKGROUND

An image sensing device is used in electronic devices to convert optical images into electrical signals. The recent development of automotive, medical, computer and communication industries is leading to an increase in demand for higher-performance image sensing devices in various devices such as smartphones, digital cameras, camcorders, personal communication systems (PCSs), game consoles, surveillance cameras, medical micro-cameras, robots, and infrared (IR) sensing devices.

Image sensing devices may be broadly classified into a CCD (charge coupled device) image sensing device and a CMOS (complementary metal oxide semiconductor) image sensing device.

The CCD image sensing devices are smaller in size and consume less power than the CCD image sensors. The CMOS technology enables image sensors and other electrical circuits to be integrated into a single chip, thereby making it possible to produce highly-integrated, lower-power consumption electronic devices at a lower cost. For these reasons, the CMOS image sensing devices dominate in many consumer goods such as smartphones.

SUMMARY

The embodiments of the disclosed technology relate to an image sensing device configured to operate in various illuminance environments.

Some embodiments of the disclosed technology relate to an image sensing device including a dual conversion gain transistor, thereby providing an image that is more robust to noise in lower illuminance areas.

In an embodiment of the disclosed technology, an image sensing device may include an imaging pixel array including a plurality of imaging pixels, each imaging pixel structured to detect incident light and to generate a pixel signal, the plurality of imaging pixels including (1) first imaging pixels that are grouped into a plurality of first pixel groups each first pixel group including different first imaging pixels at least one of which is in a different color from others, and (2) second imaging pixels that are grouped into a plurality of second pixel groups wherein each second pixel group include second imaging pixels in the same color, a plurality of second floating diffusion regions disposed in the second pixel groups, respectively, each second floating diffusion region located at or near a center portion of, and surrounded by, second imaging pixels in each second pixel group, a sensing node coupled to at least one of the first floating diffusion regions to sense a signal of the at least one of the first floating diffusion regions and the sensing node coupled to at least one of the second floating diffusion regions to sense a signal of the at least one of the second floating diffusion regions, and a dual conversion gain transistor coupled between the sensing node and at least one of first floating diffusion region and second floating diffusion region to produce different signal gains on a signal from the first floating diffusion region or the second floating diffusion region based on different levels of incident light.

In some implementations, the one of the first pixel groups and the one of the second pixel groups located adjacent to the one of the first pixel groups may be configured to share one of the plurality of imaging pixels.

In some implementations, the image sensing device may further include a drive transistor configured to amplify a signal received from the sensing node, a selection transistor configured to output the signal amplified by the drive transistor to a signal line, and a reset transistor configured to remove photocharges accumulated in each of the first floating diffusion (FD) regions, the second floating diffusion (FD) regions, and the sensing node. Here, the drive transistor, the selection transistor, and the reset transistor may be shared by the one of the first pixel groups and the one of the 4SUM pixel groups.

In some implementations, the dual conversion gain transistor, the drive transistor, the selection transistor, and the reset transistor may be disposed in a shared transistor region located adjacent to a pixel region in which the imaging pixels are arranged, and the shared transistor region and the pixel region in which the imaging pixels may be arranged are alternately arranged.

In some implementations, the drive transistor and the selection transistor may be disposed in a first shared transistor region, and the dual conversion gain transistor and the reset transistor may be disposed in a second shared transistor region.

In some implementations, each of the second floating diffusion regions may be physically isolated by the first or second shared transistor region.

In some implementations, each imaging pixel contained in each of the first pixel groups or each imaging pixel contained in each of the second pixel groups may include a photoelectric conversion element, a first transfer transistor coupled between one of the first floating diffusion (FD) regions and the photoelectric conversion element, and a second transfer transistor coupled between one of the second floating diffusion (FD) regions and the photoelectric conversion element.

In some implementations, the first transfer transistor and the second transfer transistor may be diagonally disposed in each imaging pixel.

In some implementations, the first transfer transistors contained in each of the first pixel groups may be disposed in a radial direction with respect to the corresponding first floating diffusion (FD) region.

In some implementations, the second transfer transistors contained in each of the second pixel groups may be disposed in a radial direction with respect to the corresponding second floating diffusion (FD) region.

In some implementations, the dual conversion gain transistor may be coupled to a corresponding first floating diffusion (FD) region through a first terminal thereof and may be coupled to a corresponding second floating diffusion (FD) region through a second terminal thereof.

In some implementations, the second terminal of the dual conversion gain transistor may be coupled to the sensing node, and the sensing node may be coupled to a gate terminal of the drive transistor and one terminal of the reset transistor.

In some implementations, when photocharges temporarily stored in a corresponding first floating diffusion (FD) region are transferred to the sensing node, the dual conversion gain transistor may be activated, and when photocharges temporarily stored in a corresponding second floating diffusion (FD) region are transferred to the sensing node, the dual conversion gain transistor may be selectively activated according to a degree of noise.

In some implementations, the dual conversion gain transistor may be coupled to a corresponding second floating diffusion (FD) region through a first terminal thereof, and may be coupled to a corresponding first floating diffusion (FD) region through a second terminal thereof.

In some implementations, the second terminal of the dual conversion gain transistor may be coupled to the sensing node, and the sensing node may be coupled to a gate terminal of the drive transistor and one terminal of the reset transistor.

In some implementations, when photocharges temporarily stored in a corresponding second floating diffusion (FD) region are transferred to the sensing node, the dual conversion gain transistor may be activated, and when photocharges temporarily stored in a corresponding first floating diffusion (FD) region are transferred to the sensing node, the dual conversion gain transistor may be selectively activated according to an intensity of reception light applied to the imaging pixel.

In some implementations, the first transfer transistors contained in each of the first pixel groups may be activated at different time points so as to transfer photocharges generated by the photoelectric conversion element to the corresponding first floating diffusion (FD) region.

In some implementations, the second transfer transistors contained in each of the second pixel groups may be simultaneously activated so as to transfer photocharges generated by the photoelectric conversion element to the corresponding second floating diffusion (FD) region.

In another embodiment of the disclosed technology, an image sensing device may include a plurality of imaging pixels arranged such that each imaging pixel belongs to both one of first pixel groups and one of second pixel group, a plurality of first floating diffusion (FD) regions each coupled to at least one of the plurality of imaging pixels, and disposed at a center portion of one of the first pixel groups, a plurality of second floating diffusion (FD) regions each coupled to at least one of the plurality of imaging pixels, and disposed at a center portion of one of the second pixel groups, and a sensing node structured to connect at least one of the first floating diffusion regions and structured to connect at least one of the second floating diffusion regions. Each of the first pixel groups includes four imaging pixels arranged in a 2×2 matrix array, and at least one of the four imaging pixels is in a different color from others, each of the second pixel groups includes four imaging pixels arranged in a 2×2 matrix array, and all the four imaging pixels are in the same color, and at least one of the first floating diffusion (FD) regions and the second floating diffusion (FD) regions is coupled to the sensing node by a dual conversion gain transistor.

In some implementations, a corresponding first pixel group and a corresponding second pixel group may be diagonally arranged with respect to the imaging pixel belonging to both the corresponding first and second pixel groups.

In some implementations, the dual conversion gain transistor may be coupled to a corresponding first floating diffusion (FD) region through a first terminal thereof, and may be coupled to the sensing node through a second terminal thereof, when photocharges temporarily stored in the corresponding first floating diffusion (FD) region are transferred to the sensing node, the dual conversion gain transistor may be activated, and when photocharges temporarily stored in a corresponding second floating diffusion (FD) region are transferred to the sensing node, the dual conversion gain transistor may be selectively activated according to a degree of noise.

In some implementations, the dual conversion gain transistor may be coupled to a corresponding second floating diffusion (FD) region through a first terminal thereof, and may be coupled to the sensing node through a second terminal thereof, when photocharges temporarily stored in the corresponding second floating diffusion (FD) region are transferred to the sensing node, the dual conversion gain transistor may be activated, and when photocharges temporarily stored in a corresponding first floating diffusion (FD) region are transferred to the sensing node, the dual conversion gain transistor may be selectively activated according to an intensity of light received by the imaging pixel.

In another embodiment of the disclosed technology, an image sensing device may include a Bayer pixel group configured include pixels that form a Bayer pattern and are arranged in a 2×2 matrix, a 4SUM pixel group configured to include pixels that correspond to the same colors and are arranged in a 2×2 matrix, a Bayer floating diffusion disposed at a center portion of the Bayer pixel group, a 4SUM floating diffusion (FD) region disposed at a center portion of the 4SUM pixel group, a sensing node, and a gain conversion transistor coupled between the sensing node and any one of the Bayer floating diffusion (FD) region and the 4SUM floating diffusion (FD) region.

In some implementations, the Bayer pixel group and the 4SUM pixel group located adjacent to the Bayer pixel group may be configured to share a single pixel.

In some implementations, the image sensing device may further include a drive transistor configured to amplify a signal received from the sensing node, a selection transistor configured to output the signal amplified by the drive transistor to a signal line, and a reset transistor configured to remove photocharges accumulated in each of the Bayer floating diffusion (FD) region, the 4SUM floating diffusion (FD) region, and the sensing node. The drive transistor, the selection transistor, and the reset transistor may be shared by the Bayer pixel group and the 4SUM pixel group.

In some implementations, the gain conversion transistor, the drive transistor, the selection transistor, and the reset transistor may be disposed in a shared transistor region located adjacent to a specific region in which the pixels are arranged. The shared transistor region and the specific region in which the pixels are arranged may be alternately arranged.

In some implementations, the drive transistor and the selection transistor may be disposed in a first shared transistor region, and the gain conversion transistor and the reset transistor may be disposed in a second shared transistor region.

In some implementations, the 4SUM floating diffusion (FD) region may be physically isolated by the first or second shared transistor region.

In some implementations, each pixel contained in the Bayer pixel group or each pixel contained in the 4SUM pixel group may include a photoelectric conversion element, a first transfer transistor coupled between the Bayer floating diffusion (FD) region and the photoelectric conversion element, and a second transfer transistor coupled between the 4SUM floating diffusion (FD) region and the photoelectric conversion element.

In some implementations, the first transfer transistor and the second transfer transistor may be diagonally disposed in the pixel.

In some implementations, the first transfer transistors contained in the Bayer pixel group may be disposed in a radial direction with respect to the Bayer floating diffusion (FD) region.

In some implementations, the second transfer transistors contained in the 4SUM pixel group may be disposed in a radial direction with respect to the 4SUM floating diffusion (FD) region.

In some implementations, the gain conversion transistor may be coupled to the Bayer floating diffusion (FD) region through a first terminal thereof, and may be coupled to the 4SUM floating diffusion (ED) region through a second terminal thereof.

In some implementations, the second terminal of the gain conversion transistor may be coupled to the sensing node, and the sensing node may be coupled to a gate terminal of the drive transistor and one terminal of the reset transistor.

In some implementations, when photocharges temporarily stored in the Bayer floating diffusion (ED) region are transferred to the sensing node, the gain conversion transistor may be activated, and when photocharges temporarily stored in the 4SUM floating diffusion (ED) region are transferred to the sensing node, the gain conversion transistor may be selectively activated according to the amount of noise.

In some implementations, the gain conversion transistor may be coupled to the 4SUM floating diffusion (ED) region through a first terminal thereof, and may be coupled to the Bayer floating diffusion (ED) region through a second terminal thereof.

In some implementations, the second terminal of the gain conversion transistor may be coupled to the sensing node, and the sensing node may be coupled to a gate terminal of the drive transistor and one terminal of the reset transistor.

In some implementations, when photocharges temporarily stored in the 4SUM floating diffusion (ED) region are transferred to the sensing node, the gain conversion transistor may be activated, and when photocharges temporarily stored in the Bayer floating diffusion (FD) region are transferred to the sensing node, the gain conversion transistor may be selectively activated according to the amount of reception light applied to the pixel.

In some implementations, the first transfer transistors contained in the Bayer pixel group may be activated at different time points so as to transfer photocharges generated by the photoelectric conversion element to the Bayer floating diffusion (FD) region.

In some implementations, the second transfer transistors contained in the 4SUM pixel group may be simultaneously activated so as to transfer photocharges generated by the photoelectric conversion element to the 4SUM floating diffusion (FD) region.

In another embodiment of the disclosed technology, an image sensing device may include a pixel commonly contained in a Bayer pixel group and a 4SUM pixel group, a Bayer floating diffusion (FD) region coupled to the pixel, and disposed at a center portion of the Bayer pixel group, a 4SUM floating diffusion (FD) region coupled to the pixel, and disposed at a center portion of the 4SUM pixel group, and a sensing node. The Bayer pixel group may be a group of pixels arranged in a 2×2 matrix in which the pixels are arranged to form a Bayer pattern. The 4SUM pixel group may be a group of pixels arranged in a 2×2 matrix in which the pixels corresponding to the same colors are arranged. At least one of the Bayer floating diffusion (FD) region and the 4SUM floating diffusion (FD) region may be coupled to the sensing node by a gain conversion transistor.

In some implementations, the Bayer pixel group and the 4SUM pixel group may be diagonally arranged with respect to the commonly-contained pixel.

In some implementations, the gain conversion transistor may be coupled to the Bayer floating diffusion (FD) region through a first terminal thereof, and may be coupled to the sensing node through a second terminal thereof. When photocharges temporarily stored in the Bayer floating diffusion (FD) region are transferred to the sensing node, the gain conversion transistor may be activated. When photocharges temporarily stored in the 4SUM floating diffusion (FD) region are transferred to the sensing node, the gain conversion transistor may be selectively activated according to the amount of noise.

In some implementations, the gain conversion transistor may be coupled to the 4SUM floating diffusion (FD) region through a first terminal thereof, and may be coupled to the sensing node through a second terminal thereof. When photocharges temporarily stored in the 4SUM floating diffusion (FD) region are transferred to the sensing node, the gain conversion transistor may be activated. When photocharges temporarily stored in the Bayer floating diffusion (FD) region are transferred to the sensing node, the gain conversion transistor may be selectively activated according to the amount of light received by the imaging pixel.

It is to be understood that both the foregoing general description and the following detailed description of the disclosed technology are illustrative and explanatory and are intended to provide further explanation of the disclosure as claimed.

DETAILED DESCRIPTION

The embodiments of the disclosed technology relate to an image sensing device configured to operate in various illuminance environments. In some embodiments of the disclosed technology, an image sensing device can include a variable gain circuit such as a dual conversion gain transistor that outputs signals with different signal gains according to different illumination levels of received incident light to create an image that is more robust to noise in lower illuminance areas. The inclusion of a variable gain circuit or dual conversion gain transistor allows a pixel output to be amplified at a higher gain when the received incident light has a relatively low illumination level or at a lower gain when the received incident light has a high illumination level. This feature can be used to improve the dynamic range of the imaging sensing and the signal to noise performance. Accordingly, the disclosed technology can also be used in some embodiments to acquire a high dynamic range without introducing a separate capacitive element into a high-illuminance environment.

Figure 1:
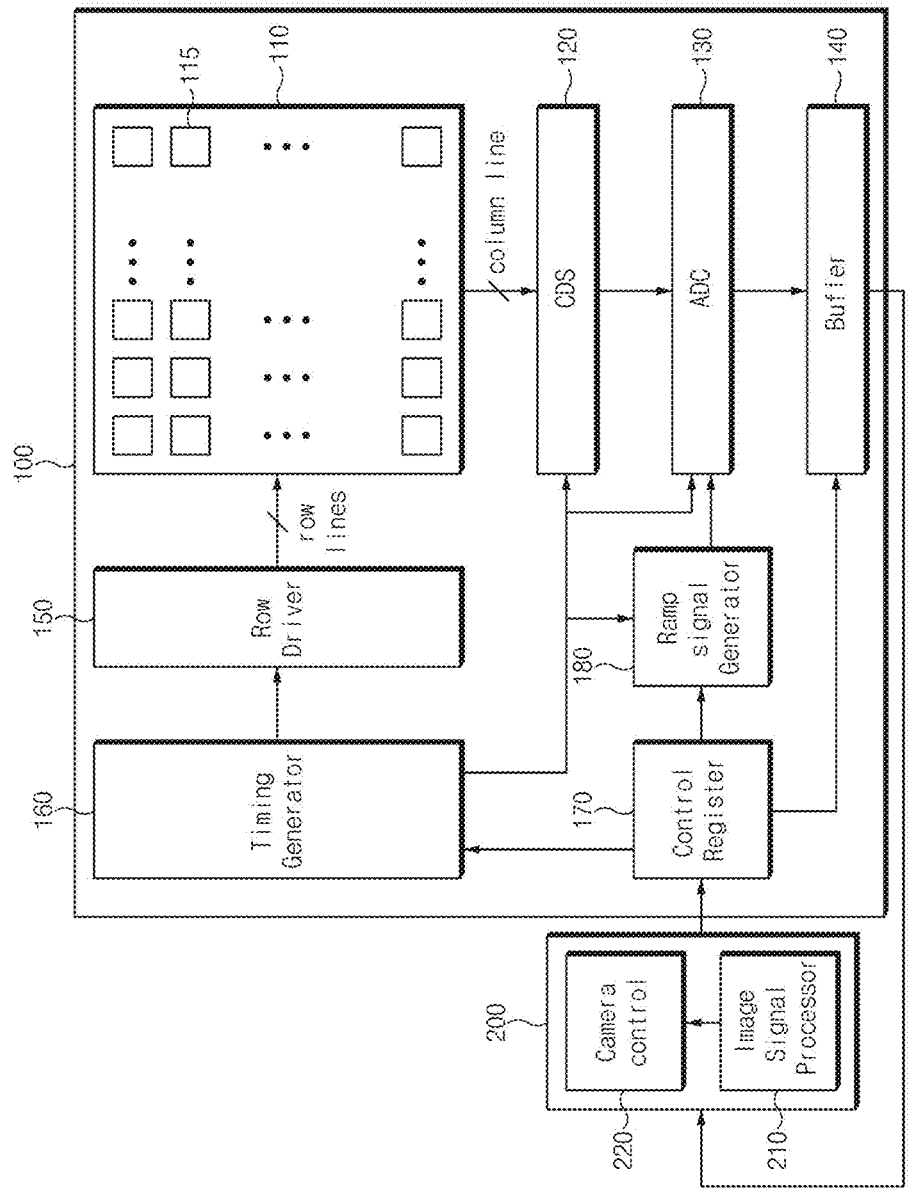
FIG. 1 is a block diagram illustrating an example of an image sensing device based on some implementations of the disclosed technology.

FIG. 1 is a block diagram illustrating an example of an image sensing device 100 based on some implementations of the disclosed technology.

In some implementations, the image sensing device 100 may include a pixel array 110 including a plurality of pixels arranged in a matrix array, a correlated double sampler (CDS) 120, an analog-to-digital converter (ADC) 130, a buffer 140, a row driver 150, a timing generator 160, a control register 170, and a ramp signal generator 180.

The image sensing device 100 may sense light beams of different wavelengths reflected from an object and focused by a lens (not shown) upon receiving a control signal from the image processor 200. The image processor 200 may transmit an output image sensed by the image sensing device 100 to an electronic device provided with a display, and the like.

The image processor 200 may include a camera controller 220, an image signal processor 210, and an interface for connecting to other devices (not shown). The camera controller 220 may control the operations of the timing generator 160 and the ramp signal generator 180 through the control register 170. In some implementations, the camera controller 220 can control the control register 170 of the image sensing device 100 using an inter-integrated circuit (I2C).

The image signal processor 220 may receive image information corresponding to an output signal of the buffer 140, and may process the received image information to display the image corresponding to the image information.

The pixel array 110 may include a plurality of pixel blocks 115 arranged in a matrix array. Each of the pixel blocks 115 may convert optical image information into an electrical image signal, and may output the electrical image signal to the correlated double sampler (CDS) 120. The pixel array 110 may include a plurality of photosensing elements that senses light and converts the sensed light into an electrical signal.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the correlated double sampler (CDS) 120 may hold and sample voltages corresponding to electrical image signals received from the pixels of the pixel array 110. For example, the correlated double sampler (CDS) 120 may perform sampling of a reference voltage level and a voltage level of the received electrical image signal in response to a clock signal received from the timing generator 160, and may transmit an analog signal corresponding to a difference between the reference voltage level and the voltage level of the received electrical image signal to the analog-to-digital converter (ADC) 130.

The analog-to-digital converter (ADC) circuit 130 may convert the received analog signal into a digital signal to provide the digital signal to the buffer 140. Examples of the analog-to-digital converter (ADC) circuit 130 may include a ramp-compare type analog-to-digital converter that compares the analog pixel signal with a reference signal such as a ramp signal that ramps up or down, and a timer counts until a voltage of the ramp signal matches the analog pixel signal.

The buffer 140 may temporarily hold or "latch" the received digital signals to sequentially output the latched digital signals to an image signal processor. The buffer 140 may include a memory for latching the digital signal and a sense amplifier for amplifying the digital signal.

The row driver 150 may be used to activate or drive interconnect lines in the plurality of pixels of the pixel array 110 in response to an output signal of the timing generator 160. For example, the row driver 150 may generate selection signals to select any one of the row lines, and/or may generate drive signals to drive any one of the row lines.

The timing generator 160 may generate a timing signal to control the correlated double sampler (CDS) circuit 120, the analog-to-digital converter (ADC) circuit 130, the row driver 150, and the ramp signal generator 180.

The control register 170 may generate control signals to control the buffer 140, the timing generator 160, and the ramp signal generator 180, such that operations of the buffer 140, the timing generator 160, and the ramp signal generator 180 are controlled according to the generated control signals. In this case, the control register 170 may operate under control of the camera controller 220.

The ramp signal generator 180 may generate a ramp signal to control an image signal received from the buffer 140 in response to a control signal received from the timing generator 160.

Figure 2:
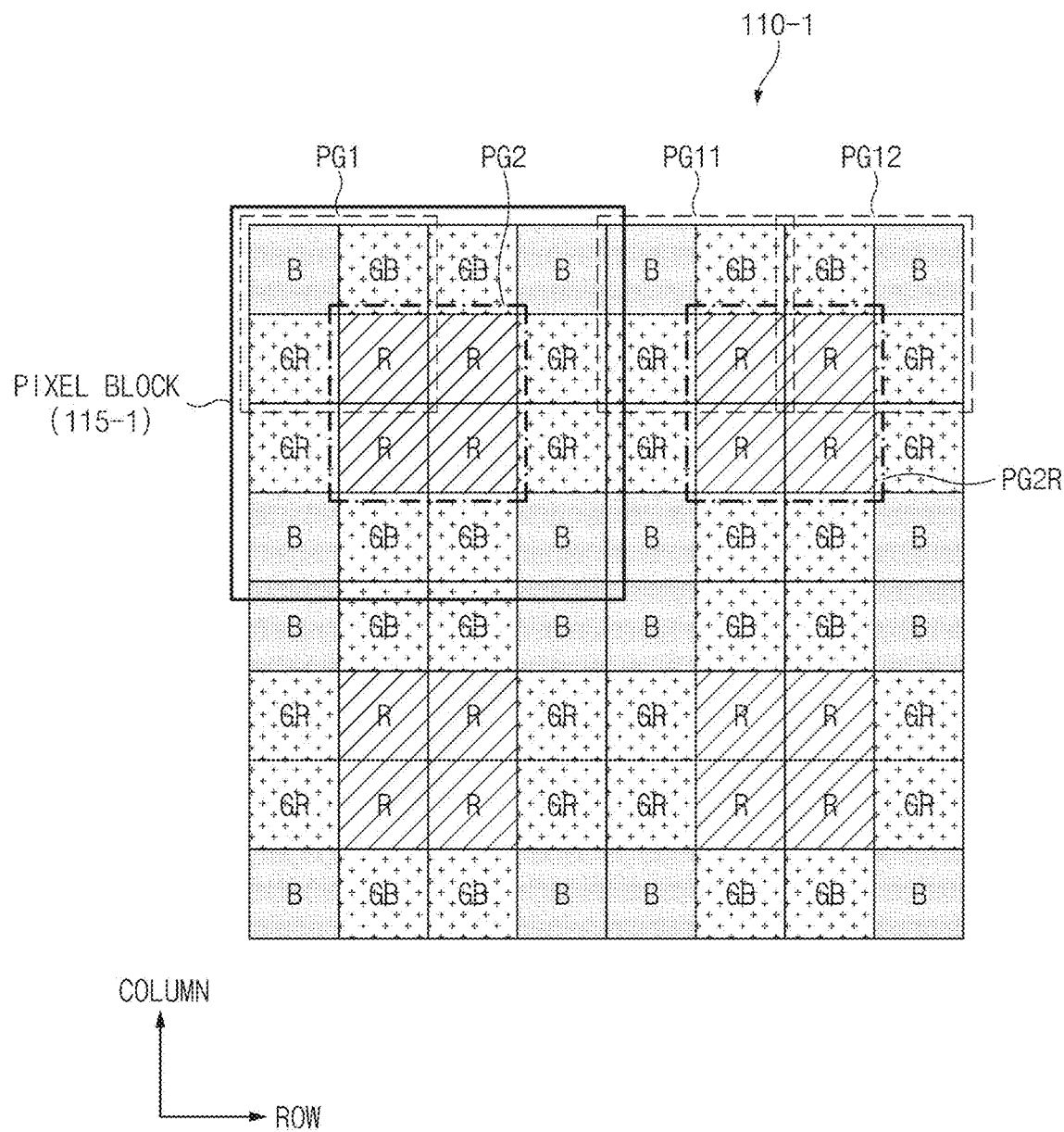
FIG. 2 is a schematic diagram illustrating an example of a pixel array of the image sensing device based on some implementations of the disclosed technology.

FIG. 2 is a schematic diagram illustrating an example of a pixel array of the image sensing device 100 based on some implementations of the disclosed technology.

Referring to FIG. 2, the pixel array 110-1 may include a plurality of pixels with color filters thereon. Photons reaching the plurality of pixels generate electrons, which are transferred to corresponding floating diffusion regions. Although not illustrated in FIG. 2, the pixel array 110-1 may also include the floating diffusion (FD) regions and transistors that are used to transfer the electrons generated by the pixels.

In the context of this patent document, the term "unit pixel" can be used to indicate a combination of a semiconductor device that converts light into electrical current and a color filter arranged over each semiconductor device.

In addition, the term "green pixel" (GR and GB) can be used to indicate a unit pixel with a green color filter, the term "red pixel" (R) can be used to indicate a unit pixel with a red color filter, and the term "blue pixel" (B) can be used to indicate a unit pixel with a blue color filter. In some implementations, the unit pixels in the pixel array 110-1 can be arranged in the Bayer pattern. In one example, each 2×2 sub-array of the pixel array 110-1 arranged in the Bayer pattern may include two green pixels (GR and GB), a red pixel (R), and a blue pixel (B). Two green pixels GR and GB in the Bayer pattern may be diagonally arranged in a 2×2 matrix array. In this case, a green pixel adjacent to the red pixel (R) in a row direction will hereinafter be denoted by "GR," and a green pixel adjacent to the blue pixel (B) in a row direction will hereinafter be denoted by "GB."

In some implementations, the unit pixels may be arranged in a Quad Bayer pattern. The Quad Bayer pattern places four pixels with the same color next to each other to achieve high sensitivity and high resolution.

That is, the Quad Bayer pattern may be a Bayer pattern that is arranged such that adjacent 2×2 pixels are the same color. In some implementations, a 4×4 unit Quad Bayer pattern may include eight green pixels (GB and GR), four red pixels (R), and four blue pixels (B) arranged such that four pixels with the same color are arranged next to each other.

In the context of this patent document, the term "Bayer pixel group" (e.g., PG1) can be used to indicate a group of pixels including four pixels that form the Bayer pattern arranged in a 2×2 matrix array.

Two green pixels in the Bayer pattern may be diagonally arranged in the 2×2 matrix. Therefore, the Bayer pixel group PG1 may be determined to be one of four patterns.

That is, four positions where unit pixels can be arranged in the 2×2 matrix can be determined. Assuming that a position corresponding to a first column of a first row in the 2×2 matrix is set to a first position, a position corresponding to a second column of the first row in the 2×2 matrix is set to a second position, a position corresponding to a first column of a second row in the 2×2 matrix is set to a third position, a position corresponding to a second column of the second row in the 2×2 matrix is set to a fourth position, green pixels (GR and GB) can be arranged either at the first position and the fourth position or at the second position and the third position.

When the green pixels (GB and GR) are disposed at the second position and the third position, the blue pixels (B) may be disposed at the first position or the fourth position, and the red pixels (R) may be disposed at the remaining positions. When the green pixels (GR and GB) are disposed at the first position and the fourth position, the red pixels (B) may be disposed at the second position or the third position, and the blue pixels (B) may be disposed at the remaining positions.

A first pattern in which the blue pixels (B) are disposed at the first position, the red pixels (R) are disposed at the fourth position, and the green pixels (GB and GR) are disposed at the second position and the third position may refer to a first Bayer pattern. A second pattern in which the blue pixels (B) are disposed at the second position, the red pixels (R) are disposed at the third position, and the green pixels (GB and GR) are disposed at the first position and the fourth position may refer to a second Bayer pattern. A third pattern in which the blue pixels (B) are disposed at the third position, the red pixels (R) are disposed at the second position, and the green pixels GB and GR are disposed at the first position and the fourth position may refer to a third Bayer pattern. A fourth pattern in which the blue pixels (B) are disposed at the fourth position, the red pixels (R) are disposed at the first position, and the green pixels (GB and GR) are disposed at the second position and the third position may refer to a fourth Bayer pattern.

In addition, when the unit pixels of the pixel array 110-1 are arranged in the Quad Bayer pattern, the contiguous (or adjacent) Bayer pixel groups PG11 and PG12 may be arranged in a manner that unit pixels corresponding to the same colors (for example, green and/or red) from among the unit pixels contained in the pixel group may be arranged contiguous (or adjacent) to each other.

As discussed above, in the Quad Bayer pattern, adjacent 2×2 pixels are the same color. In the context of this patent document, the term "4SUM pixel group" (e.g., PG2) can be used to indicate a pixel group including adjacent 2×2 pixels in the same color.

4SUM pixel groups contiguous or adjacent to each other may form the Quad Bayer pattern. The 4SUM pixel group may be a 2×2 red pixels (R) next to each other, a 2×2 blue pixels (B) next to each other, or a 2×2 green pixels (GB and GR) next to each other.

Referring to FIG. 2, each unit pixel may be regarded as a part of the Bayer pixel group and the 4SUM pixel group. For example, the red pixel (R) disposed at a certain position corresponding to a second column of a second row of the Bayer pixel group PG11 may also belong to the 4SUM pixel group PG2R. Each unit pixel may belong to a Bayer pixel group and a 4SUM pixel group in common.

In addition, the Bayer pixel group and the 4SUM pixel group that include a common unit pixel may be diagonally arranged with respect to the common unit pixel. For example, the Bayer pixel group PG11 and the 4SUM pixel group PG2R may be diagonally arranged with respect to the red pixel (R) disposed at a position corresponding to the second column of the second row of the Bayer pixel group PG11.

Referring to FIG. 2, the pixel block 115-1 may denote a unit array of the pixel array 110-1. That is, the pixel array 110-1 may include a plurality of pixel blocks 115-1 repeatedly arranged in a row or column direction.

Although the pixel block 115-1 shown in FIG. 2 includes the Bayer pixel groups (e.g., groups each including PG1) each including four contiguous Bayer patterns (i.e., first to fourth Bayer patterns), four 4SUM pixel groups (e.g., groups each including PG2) contiguous or adjacent to each other can also be defined as a pixel block.

Figure 3:
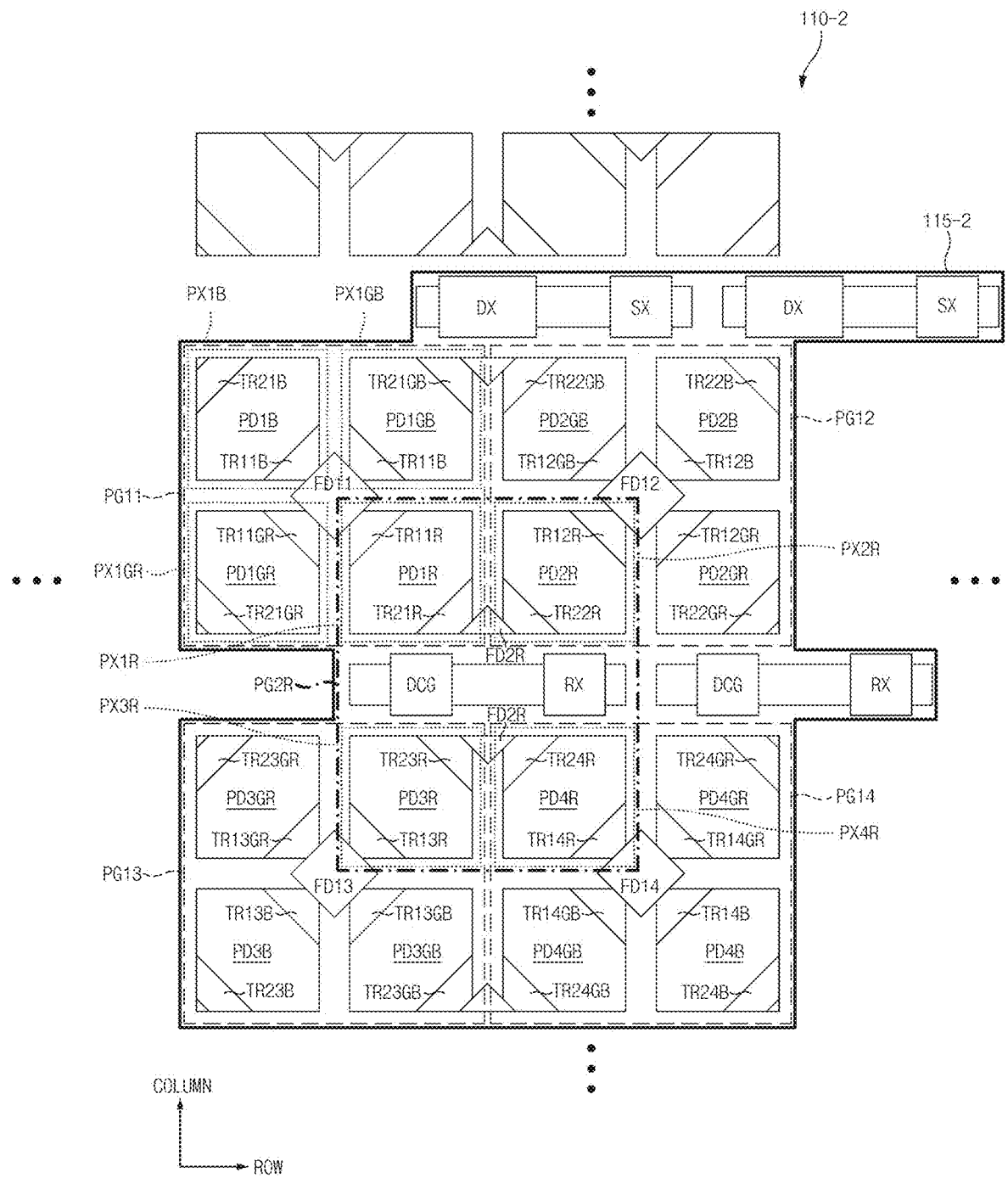
FIG. 3 is a layout diagram illustrating a pixel block, pixel groups, and transistors in the image sensing device based on some implementations of the disclosed technology.

FIG. 3 is a layout diagram illustrating the pixel block, pixel groups, and transistors in the image sensing device based on some implementations of the disclosed technology.

In FIG. 3, like elements are referenced with like numerals and their features are the same or similar. Therefore, by way of example, the discussion below will focus on one group PG11 from among the Bayer pixel groups and one group PG2R from among the 4SUM pixel groups.

The pixel block 115-2 in the pixel array 110-2 of the image sensing device may include unit pixels (PX1B, PX1GB, PX1GR, PX1R, PX2R, PX3R, PX4R, etc.), a drive transistor DX, a selection transistor SX, a reset transistor RX, and a variable gain circuitry such as a dual conversion gain transistor DCG that produces different signal gains for different illumination levels of incident light to improve the dynamic range of the imaging sensing and the signal to noise performance.

The drive transistors (DX), the selection transistors (SX), the reset transistors (RX), and the dual conversion gain transistors (DCG) may be shared by the pixel groups (PG11, PG2R, etc.), such that the above transistors may be used as shared transistors.

In the pixel block 115-2, one region in which shared transistors are disposed and the other region in which unit pixels are disposed may be alternately arranged.

That is, a region (i.e., a first shared transistor region) in which the drive transistor DX and the selection transistor SX are disposed, a region (i.e., a first pixel region) in which the unit pixels are disposed, a region (i.e., a second shared transistor region) in which the dual conversion gain transistor DCG and the reset transistor RX are disposed, and a region (i.e., a second pixel region) in which the unit pixels are disposed may be alternately arranged in the pixel block 115-2, and may also be repeatedly arranged in the pixel array 110-2.

The first shared transistor region of the pixel block 115-2 may include two drive transistors (DX) and two selection transistors (SX). The second shared transistor region of the pixel block 115-2 may include two dual conversion gain transistors (DCG) and two reset transistors (RX).

The pixel block 115-2 may include four Bayer pixel groups PG11, PG12, PG13, and PG14 respectively including the first to fourth Bayer patterns.

The Bayer pixel group PG11 may refer to the first Bayer pixel group PG11. The Bayer pixel group PG12 may refer to the second Bayer pixel group PG12. The Bayer pixel group PG13 may refer to the third Bayer pixel group PG13. The Bayer pixel group PG14 may refer to the fourth Bayer pixel group PG14.

In association with the first to fourth Bayer pixel groups PG11, PG12, PG13, and PG14, two pixel groups may be disposed in the first pixel region and other two pixel groups may be disposed in the second pixel region. For example, the first Bayer pixel group PG11 and the second Bayer pixel group PG12 may be disposed in the first pixel region, and the third Bayer pixel group PG13 and the fourth Bayer pixel group PG14 may be disposed in the second pixel region. The first to fourth Bayer pixel groups PG11, PG12, PG13, and PG14 may be disposed in the first pixel region and the second pixel region in a manner that the unit pixels having the same color are contiguous or adjacent to each other.

The first Bayer pixel group PG11 may include the Bayer floating diffusion (FD) region FD11. The second Bayer pixel group PG12 may include the Bayer floating diffusion (FD) region FD12. The third Bayer pixel group PG13 may include the Bayer floating diffusion (FD) region FD13. The fourth Bayer pixel group PG14 may include the Bayer floating diffusion (FD) region FD14.

The Bayer floating diffusion (FD) region FD11 contained in the first Bayer pixel group PG11 may refer to a first Bayer floating diffusion (FD) region FD11. The Bayer floating diffusion (FD) region FD12 contained in the second Bayer pixel group PG12 may refer to a second Bayer floating diffusion (FD) region FD12. The Bayer floating diffusion (FD) region FD13 contained in the third Bayer pixel group PG13 may refer to a third Bayer floating diffusion (FD) region FD13. The Bayer floating diffusion (FD) region FD14 contained in the fourth Bayer pixel group PG14 may refer to a fourth Bayer floating diffusion (FD) region FD14. The Bayer floating diffusion (FD) region FD11 may be disposed at the center portion of the first Bayer pixel group PG11. The Bayer floating diffusion (FD) region FD12 may be disposed at the center portion of the second Bayer pixel group PG12. The Bayer floating diffusion (FD) region FD13 may be disposed at the center portion of the third Bayer pixel group PG13. The Bayer floating diffusion (FD) region FD14 may be disposed at the center portion of the fourth Bayer pixel group PG14.

The pixel block 115-2 may include a 4SUM pixel group PG2R provided with four unit pixels having the same color filters. Although the pixel block 115-2 shown in FIG. 3 illustrates the 4SUM pixel group PG2R provided with four red pixels PX1R, PX2R, PX3R, and PX4R by way of example, and it should be noted that the 4SUM pixel group contained in the pixel block may include other pixels (for example, green or blue pixels) in some implementations.

Although the above-mentioned embodiment has been focused on the 4SUM pixel group PG2R shown in FIG. 3 for convenience of description, it should be noted that the 4SUM pixel group provided with pixels having other colors can also be included. Therefore, in order to distinguish the 4SUM pixel group PG2R shown in FIG. 3 from other 4SUM pixel groups to be described later, the 4SUM pixel group PG2R shown in FIG. 3 will hereinafter be referred to as a first 4SUM pixel group PG2R.

The first 4SUM pixel group PG2R may include a 4SUM floating diffusion (FD) FD2R. The 4SUM floating diffusion (FD) region FD2R may be disposed at the center portion of the 4SUM pixel group PG2R. In FIG. 3, the 4SUM pixel group PG2R is physically isolated by the second shared transistor region, such that the 4SUM floating diffusion (FD) region FD2R in the layout structure can be disposed in the first pixel region and the second pixel region in a distributed manner. In contrast, the 4SUM floating diffusion (FD) region FD2R disposed in the first pixel region and the remaining 4SUM floating diffusion (FD) region FD2R disposed in the second pixel region may be electrically interconnected through conductive lines such as metal lines, such that the interconnected 4SUM floating diffusion (FD) region FD2R may operate as a single floating diffusion (FD) region.

In order to distinguish the 4SUM floating diffusion (FD) region disposed at the center portion of the first 4SUM pixel group (PG2R) from other 4SUM floating diffusion (FD) regions contained in other 4SUM pixel groups, the 4SUM floating diffusion (FD) region disposed at the center portion of the first 4SUM pixel group (PG2R) will hereinafter be referred to as a first 4SUM floating diffusion (FD) region FD2R.

Each of the pixel groups PG11, PG12, PG13, PG14, and PG2R may include four unit pixels. In some implementations, the first Bayer pixel group PG11 may include two green pixels PX1GB and PX1GR, a single red pixel PX1R, and a single blue pixel PX1B. In addition, the first 4SUM pixel group (PG2R) may include four red pixels PX1R, PX2R, PX3R, and PX4R.

Unit pixels contained in each of the pixel groups PG11, PG12, PG13, PG14, and PG2R may include a photoelectric conversion element, a first transfer transistor, a second transfer transistor, some parts of the Bayer floating diffusion (FD) region, and some parts of the 4SUM floating diffusion (FD) region. By way of example, the first Bayer pixel group PG11 will be discussed for convenience of description. The red pixel PX1R contained in the first Bayer pixel group PG11 may include a photoelectric conversion element PD1R, a first transfer transistor TR11R, a second transfer transistor TR21R, some parts of the first Bayer floating diffusion (FD) region FD11, and some parts of the first 4SUM floating diffusion (FD) region FD2R.

The unit pixels PX1B, PX1GB, PX1GR, and PX1R contained in the first Bayer pixel group PG11 may include a photoelectric conversion element (such as a photodiode) PD1B, a photoelectric conversion element PD1GB, a photoelectric conversion element PD1GR, and a photoelectric conversion element PD1R. Each of the photoelectric conversion elements PD1B, PD1GB, PD1GR, and PD1R may absorb incident light, and may accumulate charges corresponding to the amount of the absorbed incident light.

Although not shown in the drawings, the color filters may be disposed in each of the unit pixels PX1B, PX1GB, PX1GR, and PX1R, and the color filters can respectively overlap with the photoelectric conversion elements PD1B, PD1GB, PD1GR, and PD1R with respect to the direction along which incident light is incident. Each of the photoelectric conversion elements PD1B, PD1GB, PD1GR, and PD1R may generate photocharges corresponding to the intensity of incident light at a wavelength band that is selectively received after passing through the color filter, and may accumulate the photocharges.

Each of the photoelectric conversion elements PD1B, PD1GB, PD1GR, and PD1R may be implemented as a photodiode, a phototransistor, a photogate, a pinned photodiode (PPD) or a combination thereof.

The first transfer transistor and the second transfer transistor contained in the unit pixels may be coupled to the floating diffusion (FD) regions and the photoelectric conversion elements, such that the first and second transfer transistors can transfer photocharges generated by the photoelectric conversion elements to the floating diffusion (FD) regions. In some implementations, the transmission (Tx) efficiency can be improved by arranging the transfer transistors in the pixel layout diagram in a manner that a contact region between each of the floating diffusion (FD) regions and each of the photoelectric conversion elements can be maximized in size and each of the photoelectric conversion elements can provide a sufficient area to receive the reception (Rx) light.

Referring to the red pixel PX1R contained in the first Bayer pixel group PG11, the first transfer transistor TX11R of the red pixel PX1R may be arranged contiguous or adjacent to the first Bayer floating diffusion (FD) region FD11, and the second transfer transistor TX21R of the red pixel PX1R may be arranged contiguous or adjacent to the first 4SUM floating diffusion (FD) region FD2R.

In other words, the first transfer transistor TX11R may be coupled between the photoelectric conversion element PD1R and the first floating diffusion (FD) region FD11, and the second transfer transistor TX21R may be coupled between the photoelectric conversion element PD1R and the first 4SUM floating diffusion (FD) region FD2R, such that the first transfer transistor and the second transfer transistor may be diagonally arranged in one pixel. Referring to the arrangement structure of the first transfer transistors TR11B, TR11GB, TR11GR, and TR11R contained in the first Bayer pixel group PG11, the first transfer transistors TR11B, TR11GB, TR11GR, and TR11R may be radially arranged with respect to the first Bayer floating diffusion (FD) region FD11. This is because the photoelectric conversion elements PD1B, PD1GB, PD1GR, and PD1R contained in the first Bayer pixel group PG11 are arranged to share the first Bayer floating diffusion (FD) region FD11.

Likewise, as can be seen from the second transfer transistors TR21R, TR22R, TR23R, and TR24R contained in the first 4SUM pixel group PG2R, the second transfer transistors TR21R, TR22R, TR23R, and TR24R may be radially arranged with respect to the first 4SUM floating diffusion (FD) region FD2R. This is because the photoelectric conversion elements PD1R, PD2R, PD3R, and PD4R contained in the first 4SUM pixel group PG2R are arranged to share the first 4SUM floating diffusion (FD) region FD2R.

As described above, the floating diffusion (FD) region is shared in a single pixel group, and photocharges transmitted to the floating diffusion (FD) region can be sensed and processed by the shared transistors DX, SX, RX, and DCG in the single pixel group, such that the positions of the shared transistors of the first transistor region and the second transistor region may be changed according to the arrangement of the Bayer floating diffusion (FD) regions and the 4SUM floating diffusion (FD) regions.

The floating diffusion (FD) regions may be coupled to the shared transistors through conductive lines such as metal lines. When complexity of the conductive lines increases in the layout structure, characteristics of the image sensing device 100 may be deteriorated by noise occurrence, such that the floating diffusion (FD) regions and the shared transistors can be arranged to optimize arrangement of the conductive lines such as metal lines.

In some implementations, two Bayer floating diffusion (FD) regions FD11 and FD13 and two 4SUM floating diffusion (FD) regions FD2R and FD2G (see FIG. 4) may share one drive transistor DX, one selection transistor SX, one dual conversion gain transistor DCG, and one reset transistor RX from among the shared transistors contained in the pixel block 115-2.

In this case, transistors are arranged in a manner that two Bayer floating diffusion (FD) regions FD11 and FD13 are coupled to one terminal of the dual conversion gain transistor DCG and two 4SUM floating diffusion (FD) regions FD2R and FD2G (see FIG. 4) are coupled to a gate terminal of the drive transistor DX, such that the shared transistors may be arranged in the first transistor region and the second transistor region as shown in FIG. 3. The connection relationship between the floating diffusion (FD) regions and the shared transistors will hereinafter be described in detail with reference to FIG. 4.

Figure 4:
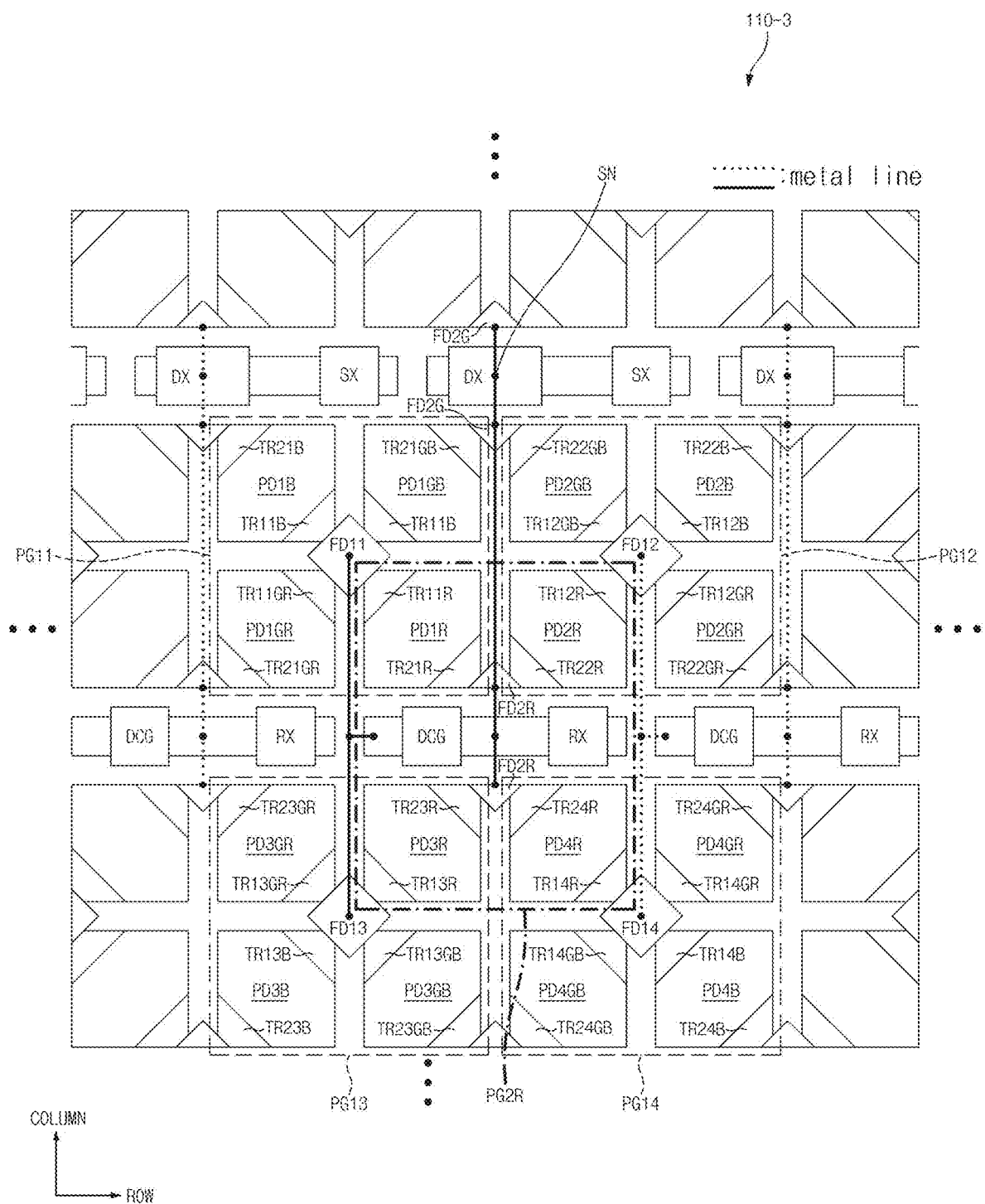
FIG. 4 is a layout diagram illustrating pixel groups and transistors in the image sensing device based on some implementations of the disclosed technology.

FIG. 4 is a layout diagram illustrating pixel groups and transistors in the image sensing device 100 based on some implementations of the disclosed technology.

FIG. 4 also shows interconnects (e.g., metal lines) between the pixel groups and the transistor in the image sensing device 100 based on some implementations of the disclosed technology.

Since the interconnect (or conductive lines) such as metal lines are repeatedly arranged in the image sensing device 100, the discussion below will focus on the conductive lines (i.e., metal lines) denoted by solid lines.

In some implementations, the metal lines can provide interconnections to two Bayer floating diffusion (FD) regions FD11 and FD13 and two 4SUM floating diffusion (FD) regions FD2R and FD2G so that they can share the drive transistor DX, the selection transistor SX, the dual conversion gain transistor DCG, and the reset transistor RX.

In order to distinguish the 4SUM floating diffusion (FD) region FD2G shown in FIG. 4 from the first 4SUM floating diffusion (FD) region FD2R, the 4SUM floating diffusion (FD) region FD2G shown in FIG. 4 will hereinafter be referred to as a second 4SUM floating diffusion (FD) region FD2G.

In some implementations, the first Bayer floating diffusion (FD) region FD11 and the third Bayer floating diffusion (FD) region FD13 may be coupled to one terminal of the dual conversion gain transistor DCG through metal lines. The other terminal of the dual conversion gain transistor DCG may be coupled to the first 4SUM floating diffusion (FD) region FD2R and the second 4SUM floating diffusion (FD) region FD2G through metal lines.

The 4SUM floating diffusion (FD) regions FD2R and FD2G coupled to the dual conversion gain transistor DCG may be coupled to a sensing node SN, and the sensing node SN may be coupled to the gate terminal of the drive transistor DX.

The image sensing device 100 based on some implementations of the disclosed technology may perform two different operations in two different modes, respectively.

The modes may be determined according to the image capturing environment of the image sensing device 100, and the control register 170 may be controlled by the image processor 200 to determine how the transistors are operated in each mode. In more detail, the camera controller 220 of the image processor 200 may output a mode control signal of the control register 170, and the control register 170 having received the mode control signal may control operations of the respective transistors contained in the image sensing device 100 in response to the mode control signal.

The camera controller 220 may change the mode control signal to be output to the control register 170 in response to a controller control signal received from the image signal processor 210. The image processor 200 based on some implementations of the disclosed technology may determine the operation of the transistors in each of the operation modes based on the image capturing environment by referring to image information captured by the image sensing device 100.

The image signal processor 210 may transmit the controller control signal to the camera controller 220 by referring to image information received from the buffer 140 and a user request or illuminance information received from a separate illuminance sensor or the like.

In the first mode (i.e., Bayer mode) corresponding to one of two modes, the first transfer transistors TR11R, TR11GR, TR11GB, and TR11B may be activated and operated at different time points. In this case, the second transfer transistors TR21R, TR22R, TR23R, and TR24R may be deactivated.

The first mode (i.e., Bayer mode) may refer to a high-illuminance environment in which an image sensor can receive a sufficient amount of reception (Rx) light such that the amount of photocharges generated by each pixel is larger than those of a low-illuminance environment.

The photoelectric conversion elements PD1B, PD1GB, PD1GR, and PD1R contained in the first Bayer pixel group PG11 may be coupled to the first Bayer floating diffusion (FD) region FD11 by each of the first transfer transistors TR11B, TR11GB, TR11R, and TR11GR.

Since the first Bayer floating diffusion (FD) region FD11 is electrically coupled to the third Bayer floating diffusion (FD) region FD13, the Bayer floating diffusion (FD) regions FD11 and FD13 may receive photocharges generated by each of the photoelectric conversion elements PD1B, PD1GB, PD1R, and PD1GR through the first transfer transistors TR11B, TR11GB, TR11R, and TR11GR.

When the dual conversion gain transistor DCG is activated, four floating diffusion (FD) regions FD11, FD13, FD2R, and FD2G may be coupled in parallel to the sensing node SN.

When the dual conversion gain transistor DCG is activated, nodes of the floating diffusion (FD) regions FD11, FD13, FD2R, and FD2G in the layout structure may be directly coupled to one node, but junction capacitors of the respective floating diffusion (FD) nodes are coupled in parallel to each other. In the disclosed technology, parallel connection of the floating diffusion (FD) regions may denote that the junction capacitors between the floating diffusion (FD) regions FD11, FD13, FD2R, and FD2G are electrically coupled in parallel to each other.

In the first mode (Bayer mode), when photocharges generated by the photoelectric conversion elements PD1R, PD2R, PD3R, and PD4R contained in the first Bayer pixel group PG11 are sensed, capacitance other than parasitic capacitance of the sensing node SN may be identical to a sum of capacitances of the four floating diffusion (FD) regions FD11, FD13, FD2R, and FD2G. This is because the dual conversion gain transistor DCG can always remain activated in the first mode (Bayer mode), and examples will be discussed with reference to FIG. 6.

In the second mode (i.e., 4SUM mode), the second transfer transistors TR21R, TR22R, TR23R, and TR24R can be simultaneously activated and operated. In this case, the first transfer transistors TR11R, TR11GR, TR11GB, and TR11B may be deactivated.

The second mode (i.e., 4SUM mode) may refer to a low-illuminance environment having the small amount of reception (Rx) light, and may denote an exemplary case in which the amount of photocharges generated by each pixel is less than those of the high-illuminance environment.

The photoelectric conversion elements PD1R, PD2R, PD3R, and PD4R of the first 4SUM pixel group PG2R may be coupled to the first 4SUM floating diffusion (FD) region FD2R by the second transfer transistors TR21R, TR22R, TR23R, and TR24R. The first 4SUM floating diffusion (FD) region FD2R may be electrically coupled to the second 4SUM floating diffusion (FD) region FD2G through interconnects such as metal lines. The 4SUM floating diffusion (FD) regions FD2R and FD2G may be directly coupled to the sensing node SN, such that the 4SUM floating diffusion (FD) regions FD2R and FD2G can contribute to capacitance of the sensing node SN.

Since the first 4SUM floating diffusion (FD) region FD2R is electrically coupled to the second 4SUM floating diffusion (FD) region FD2G, the 4SUM floating diffusion (FD) regions FD2R and FD2G may receive photocharges generated by the photoelectric conversion elements PD1R, PD2R, PD3R, and PD4R through the second transfer transistors TR21R, TR22R, TR23R, and TR24R. The first 4SUM floating diffusion (FD) region FD2R and the second 4SUM floating diffusion (FD) region FD2G may operate like as a single floating diffusion (FD) region in the connection relationship between the constituent elements of the embodiment shown in FIG. 4.

In the second mode (i.e., 4SUM mode), whereas photocharges can be sensed irrespective of activation of the dual conversion gain transistor DCG, whether generated photocharges will be transferred to the Bayer floating diffusion (FD) regions FD11 and FD13 can be determined based on whether the dual conversion gain transistor DCG is activated.

The image sensing device 100 based on some implementations of the disclosed technology may adjust activation or deactivation of the dual conversion gain transistor DCG in the second mode (4SUM mode) in a manner that capacitance of the sensing node SN can increase, such that the image sensing device 100 can be robust to noise in the second mode (4SUM mode).

In more detail, the absolute amount of noise measured in a read operation may be inversely proportional to capacitance of the sensing node SN. As a result, when total capacitance of the sensing node SN increases, the amount of measurement noise can be reduced.

The floating diffusion (FD) regions FD11, FD13, FD2R, and FD2G temporarily store and accumulate the photocharges generated by the photoelectric conversion elements. The signal corresponding to a voltage of the accumulated photocharges may be transferred to the sensing node SN, and the signal transferred to the sensing node SN may be amplified and sensed by the drive transistor DX disposed in the first shared transistor region.

In more detail, a gate electrode of the drive transistor DX may receive photocharges temporarily stored in the floating diffusion (FD) regions FD11, FD13, FD2R, and FD2G through the sensing node SN. The drive transistor DX may output a power-supply voltage based on the received photocharges to the selection transistor SX. The selection transistor SX may transmit an output voltage of the drive transistor DX to an output port.

The dual conversion gain transistor DCG disposed in the second shared transistor region may be activated or deactivated according to the respective modes.

The reset transistor RX disposed in the second shared transistor region may reset each of the floating diffusion (FD) regions FD11, FD13, FD2R, and FD2G and each of the photoelectric conversion elements PD1B, PD1GB, PD1GR, PD1R, PD2R, PD3R, PD4R, etc. to the power-supply voltage level.

The transistors DX, SX, DCG, and RX disposed in each of the first shared transistor region and the second shared transistor region may be arranged in different arrangement shapes according to how the transistors DX, SX, DCG, and RX are shared in the pixel array 110-2 or according to how the metal lines such as conductive lines are arranged in the pixel array 110-2.

Figure 5:
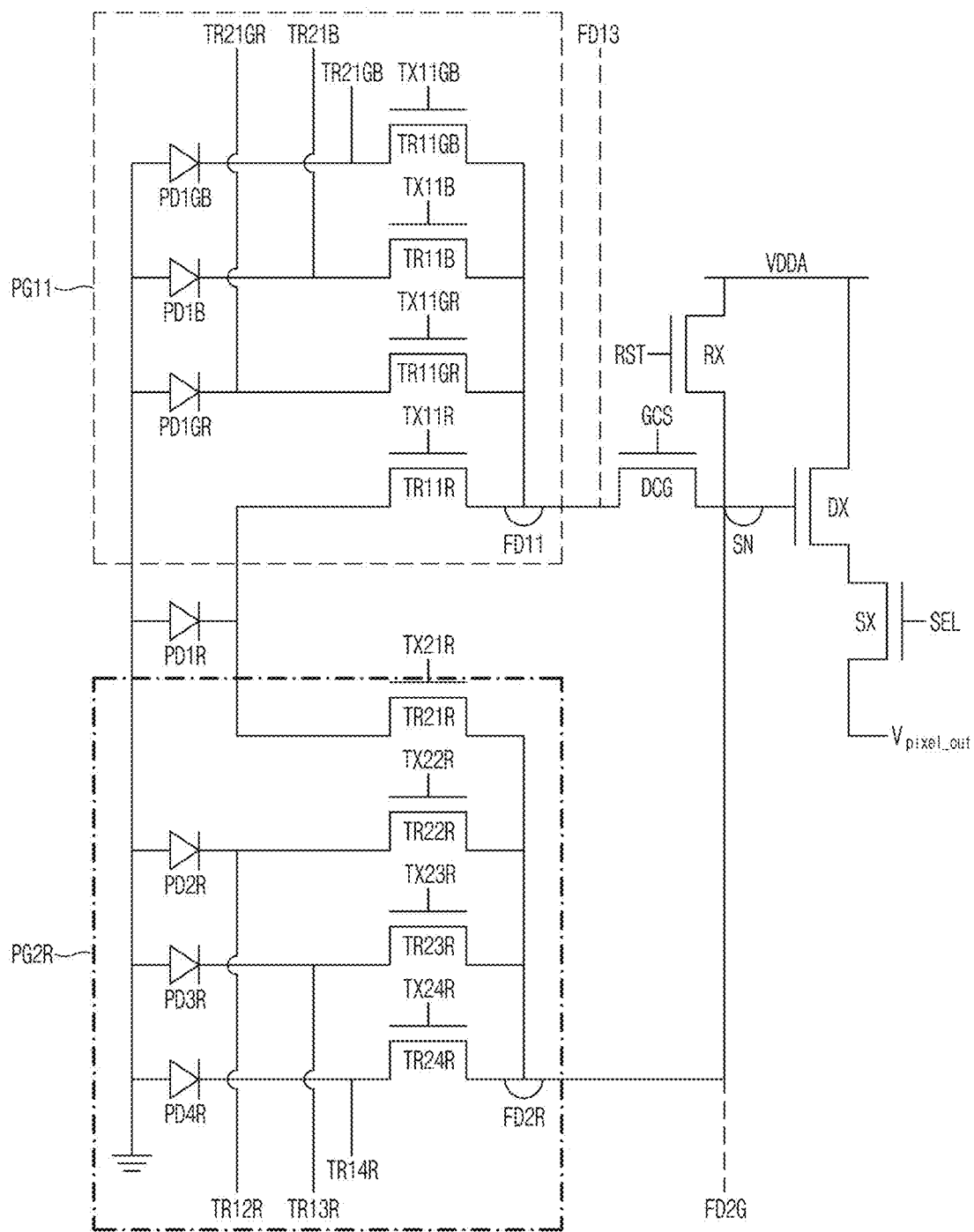
FIG. 5 illustrates some of the pixel groups shown in FIG. 4 based on some implementations of the disclosed technology.

FIG. 5 illustrates some of the pixel groups shown in FIG. 4 based on some implementations of the disclosed technology.

Since the image sensing device 100 based on some implementations of the disclosed technology is configured in a manner that the constituent elements of the entire pixel array 110-3 are arranged in the repeated arrangement structure, by ways of example, an equivalent circuit of the first Bayer pixel group PG11 and the first 4SUM pixel group PG2R will be discussed for convenience of description.

Photocharges generated by the photoelectric conversion elements PD1B, PD1GB, PD1GR, PD2R, PD3R, PD4R, etc. contained in the respective pixel groups may be transferred to different floating diffusion (FD) regions through different transfer transistors according to the respective modes.

However, as can be seen from FIG. 5, in the case of using the second transfer transistors TR21GR, TR21B, and TR21GB that do not transfer photocharges to the first Bayer floating diffusion (FD) region FD11 during the Bayer mode, or in the case of using the first transfer transistors TR12R, TR13R, and TR14R that do not transfer photocharges to the first 4SUM floating diffusion (FD) region FD2R during the 4SUM mode, only names of connected transistors are illustrated in FIG. 5 for convenience of description. In addition, as can be seen from FIG. 4, four floating diffusion (FD) regions FD11, FD13, FD2R, and FD2G may be coupled to the single sensing node SN, such that the connection relationship between the four floating diffusion (FD) regions FD11, FD13, FD2R, and FD2G with respect to the sensing node SN will be briefly illustrated.

Referring to FIG. 5, the image sensing device 100 based on some implementations of the disclosed technology may include pixel groups (PG11, PG2R, etc.), the dual conversion gain transistor DCG, the sensing node SN, the drive transistor DX, the selection transistor SX, and the reset transistor RX.

The first Bayer pixel group PG11 may include the photoelectric conversion elements PD1GB, PD1B, PD1GR, and PD1R, the transfer transistors (TR11GB, TR11B, TR11GR, TR11R, etc.), the first Bayer floating diffusion (FD) region FD11, etc. The first 4SUM pixel group PG2R may include photoelectric conversion elements PD1R, PD2R, PD3R, and PD4R, transfer transistors (TR21R, TR22R, TR23R, TR24R, etc.), the first 4SUM floating diffusion (FD) region FD2R, etc. In this case, the photoelectric conversion element PD1R may be shared by the first Bayer pixel group PG11 and the second Bayer pixel group PG2R.

Photocharges accumulated in the respective photoelectric conversion elements PD1GB, PD1B, PD1GR, PD1R, PD2R, PD3R, and PD4R may be transferred to the floating diffusion (FD) regions FD11, FD13, FD2R, and FD2G through transistors to be activated for each mode.

The transfer transistors (TR11GB, TR11B, TR11GR, etc.) may be turned on according to logic levels of the respective transfer control signals (TX11GB, TX11B, TX11GR, etc.) applied to gate terminals of the transfer transistors, such that photocharges accumulated in the photoelectric conversion elements PD1GB, PD1B, PD1GR, PD1R, PD2R, PD3R, and PD4R can be transferred to the floating diffusion (FD) regions FD11, FD13, FD2R, and FD2G.

In the Bayer mode acting as the first mode, the image sensing device 100 based on some implementations of the disclosed technology may independently transmit charges accumulated in the photoelectric conversion elements PD1GB, PD1B, PD1GR, and PD1R to the floating diffusion (FD) regions FD11, FD13, FD2R, and FD2G through the first transfer transistors TR11GB, TR11B, TR11GR, and TR11R.

In the Bayer mode acting as the first mode, in order to independently transmit photocharges accumulated in each photoelectric conversion element PD1GB, PD1B, PD1GR, and PD1R, the transfer control signals TX11GB, TX11B, TX11GR, and TX11R for the first transfer transistors TR11GB, TR11B, TR11GR, and TR11R may be applied at different time points.

In other words, in the Bayer mode acting as the first mode, the floating diffusion (FD) regions FD11, FD13, FD2R, and FD2G may separately receive charges accumulated in the photoelectric conversion elements PD1GB, PD1B, PD1GR, and PD1R of each unit pixel, such that the sensing node SN can independently sense and detect the charges accumulated in each of the photoelectric conversion elements PD1GB, PD1B, PD1GR, and PD1R.

Therefore, in the Bayer mode acting as the first mode, photocharges generated by each of the photoelectric conversion elements PD1GB, PD1B, PD1GR, and PD1R of the first Bayer pixel group PG11 can be independently sensed for each unit pixel.

In contrast, the image sensing device 100 based on some implementations of the disclosed technology can simultaneously transmit charges accumulated in the photoelectric conversion elements PD1R, PD2R, PD3R, and PD4R to the floating diffusion (FD) regions FD2R and FD2G or the floating diffusion (FD) regions FD11, FD13, FD2R and FD2G through the second transfer transistors TR21R, TR22R, TR23R, and TR24R.

In the second mode (4SUM mode), capacity of the floating diffusion (FD) region receiving photocharges may be changed according to activation or deactivation of the dual conversion gain transistor DCG. That is, when the dual conversion gain transistor DCG is deactivated, total capacity of the floating diffusion (FD) region may be denoted by the sum of capacity of the first 4SUM floating diffusion (FD) region FD2R and capacity of the second 4SUM floating diffusion (FD) region FD2G.

In contrast, when the dual conversion gain transistor DCG is activated, total capacity of the floating diffusion (FD) region receiving photocharges may be denoted by the sum of capacity of the first Bayer floating diffusion (FD) region FD11, capacity of the third Bayer floating diffusion (FD) region FD13, capacity of the first 4SUM floating diffusion (FD) region FD2R, and capacity of the second 4SUM floating diffusion (FD) region FD2G. The dual conversion gain transistor DCG may be activated when a gain conversion control signal (GCS) applied to a gate terminal of the dual conversion gain transistor DCG is at a logic high level.

In order to simultaneously transmit photocharges to the floating diffusion (FD) regions, the transfer control signals TX21R, TX22R, TX23R, and TX24R for the second transfer transistors TR21R, TR22R, TR23R, and TR24R may be simultaneously activated at a logic high level.

In the second mode (4SUM mode), the floating diffusion (FD) regions FD2R and FD2G or the floating diffusion (FD) regions FD11, FD14, FD2R, and FD2G may simultaneously receive charges accumulated in the photoelectric conversion elements PD1R, PD2R, PD3R, and PD4R, and the sensing node SN can simultaneously sense and detect the charges accumulated in the photoelectric conversion elements PD1R, PD2R, PD3R, and PD4R. Therefore, in the second mode, the photoelectric conversion elements PD1R, PD2R, PD3R, and PD4R of the first 4SUM pixel group PG2R can be sensed like as a single photoelectric conversion element. The drive transistor DX illustrated as a source follower amplifier may amplify a change in electrical potential of the sensing node SN coupled to the floating diffusion (FD) regions FD11, FD13, FD2R, and FD2G having received the photocharges, and may transmit the amplified change in electrical potential to the selection transistor SX.

In each of the first mode (Bayer mode) and the second mode (4SUM mode), photocharges applied to the sensing node SN may be transferred to the gate terminal of the drive transistor DX, such that the resultant photocharges can be amplified. In this case, the drive transistor DX may serve as a source follower. Thereafter, the amplified voltage may be output as an output voltage ($V_{pixel\_out}$) according to whether or not the control signal SEL for the selection transistor SX is applied.

Figure 6:
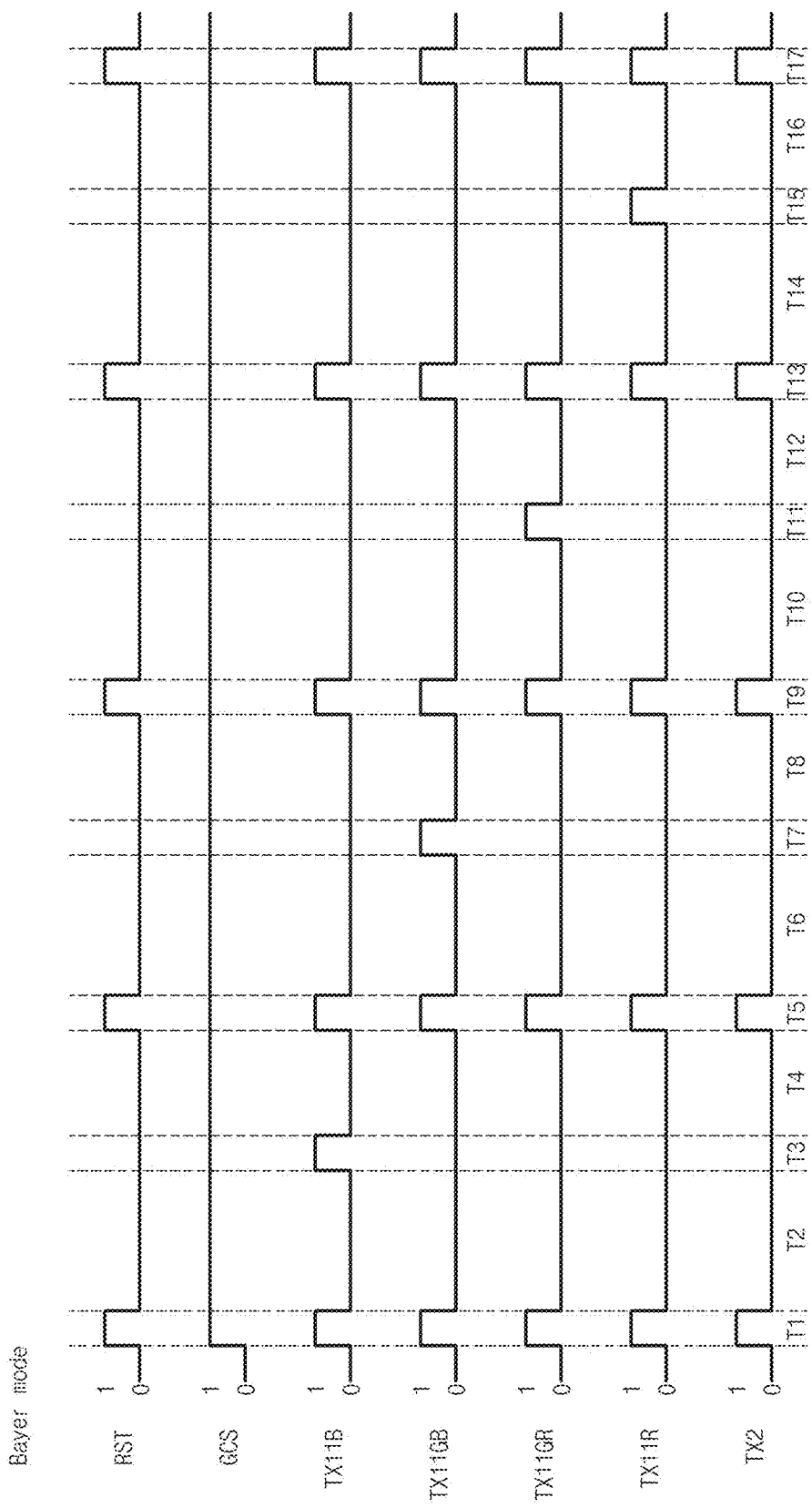
FIG. 6 is a timing diagram illustrating a method for controlling transistors in a first mode of the circuit shown in FIG. 5 based on some implementations of the disclosed technology.
Figure 7:
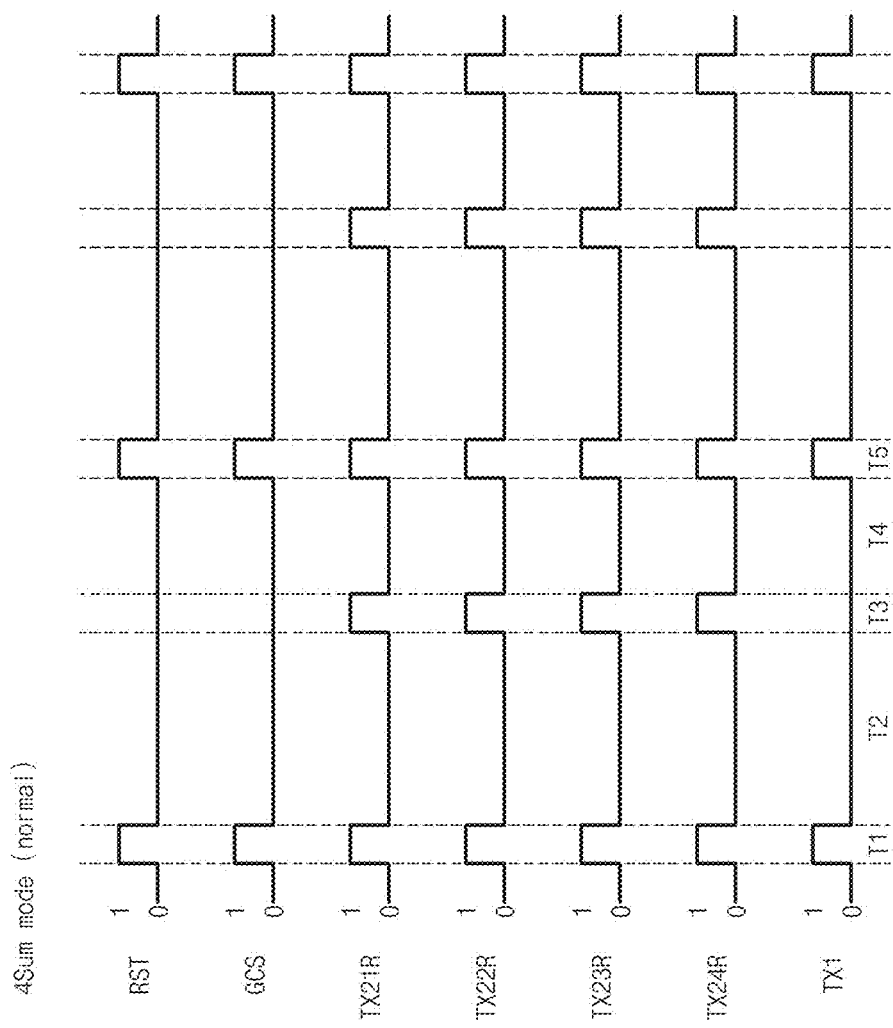
FIG. 7 is a timing diagram illustrating a method for controlling transistors in a second mode of the circuit shown in FIG. 5 based on some implementations of the disclosed technology.
Figure 8:
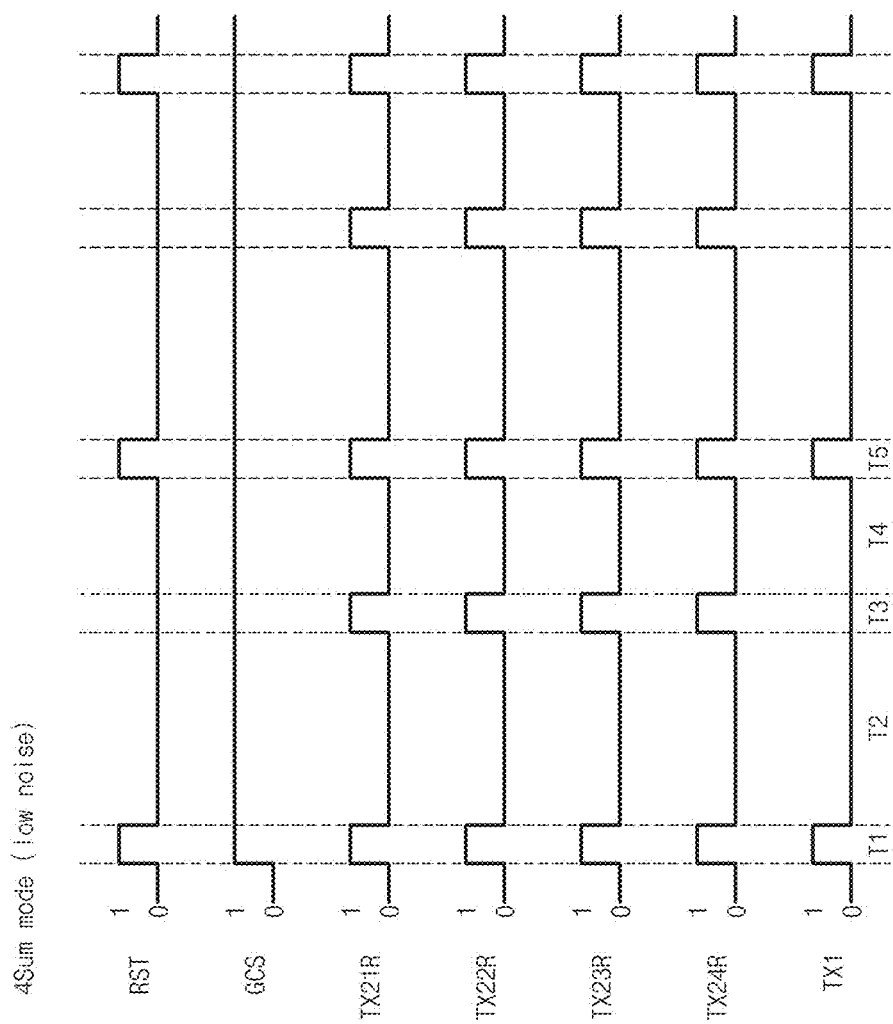
FIG. 8 is a timing diagram illustrating a method for controlling transistors in a low-noise operation of the second mode of the circuit shown in FIG. 5 based on some implementations of the disclosed technology.
Figure 9:
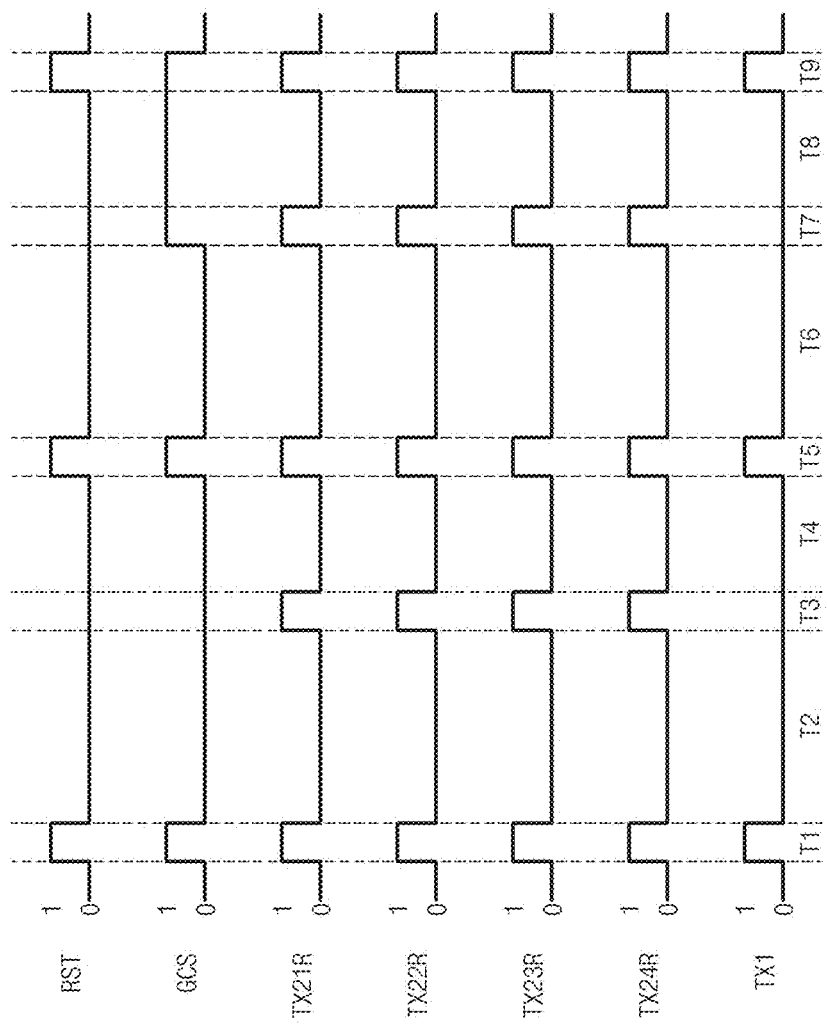
FIG. 9 is a timing diagram illustrating a method for controlling transistors in a second mode based on two measurement methods in the circuit shown in FIG. 5 based on some implementations of the disclosed technology.

FIG. 6 is a timing diagram illustrating a method for controlling transistors during the first mode (Bayer mode) of the circuit shown in FIG. 5. FIG. 7 is a timing diagram illustrating a method for controlling transistors during the second mode (4SUM mode) of the circuit shown in FIG. 5. FIG. 8 is a timing diagram illustrating a method for controlling transistors during a low-noise operation of the second mode (4SUM mode) of the circuit shown in FIG. 5. FIG. 9 is a timing diagram illustrating a method for controlling transistors during the second mode (4SUM mode) based on two measurement methods in the circuit shown in FIG. 5. For convenience of description, and the discussion here will focus on the first Bayer pixel group PG11 and the first 4SUM pixel group PG2R shown in FIG. 5. In order to control the circuit shown in FIG. 5, control signals TX11GB, TX11B, TX11GR, TX11R, TX21R, TX22R, TX23R, TX24R, RST, and GCS respectively applied to transistors TR11GB, TR11B, TR11GR, TR11R, TR21R, TR22R, TR23R, TR24R, RX, and DCG contained in the pixel groups PG11 and PG2R are illustrated in FIG. 6.

In some implementations, the drive transistor DX and the selection transistor SX are operated as discussed above, with reference to FIG. 5 and the operation of the first mode (Bayer mode) in which the signal of the sensing node SN is applied to the gate terminal of the drive transistor DX and is then amplified may be carried out in the same manner as in the second mode (4SUM mode) can be operated as will be discussed below. By way of example, the control signal RST of the reset transistor RX, the control signal GCS of the dual conversion gain transistor DCG, and control signals TX11GB, TX11B, TX11GR, TX11R, TX21R, TX22R, TX23R, TX24R, RST, and GCS of the transfer transistors TR11GB, TR11B, TR11GR, TR11R, TR21R, TR22R, TR23R, and TR24R will be discussed for convenience of description.

Each of the control signals TX11GB, TX11B, TX11GR, TX11R, TX21R, TX22R, TX23R, TX24R, RST, and GCS may have two logic levels. For convenience of description, "1" may denote a logic high level of each signal, and "0" may denote a logic low level of each signal. That is, when the control signal having a logic high level is applied to the gate terminal of each transistor, the corresponding transistor may be activated (or turned on). When the control signal having a logic low level is applied to the gate terminal of each transistor, the corresponding transistor may be deactivated (turned off).

Referring to the timing diagram of the first mode (Bayer mode) shown in FIG. 6, when the image sensing device 100 performs capturing of the first mode (Bayer mode), a time period of the operation for generating and outputting signals from the pixels of the first Bayer pixel group PG11 can be briefly classified into first to seventeenth periods T1 to T17.

In the first period T1, each of control signals TX11GB, TX11B, TX11GR, TX11R, TX2, RST, and GCS for the transistors may have a logic high level (where TX2 denotes TX21R, TX22R, TX23R, and TX24R). Since each of the control signals has a logic high level, the remaining circuits other than the drive transistor DX and the selection transistor SX can be electrically coupled to each other. As a result, charges accumulated in the interconnected constituent elements can be removed through the reset transistor RX. Thereafter, the amount of photocharges accumulated in each of the photoelectric conversion elements can be correctly measured.

In the second period T2, control signals TX11GB, TX11B, TX11GR, TX11R, and TX2 for the transfer transistors and the control signal RST for the reset transistor RX may remain at a logic low level, such that photocharges can be accumulated in each of the photoelectric conversion elements PD11GB, PG11B, PD11GR, and PD11R contained in the pixel array. As described above, each of the photoelectric conversion elements PD11GB, PG11B, PD11GR, and PD11R may include a photodiode, etc.

While photocharges are accumulated in the photoelectric conversion elements PD11GB, PG11B, PD11GR, and PD11R, the control signal (GCS) of the dual conversion gain transistor DCG may have any one of a logic high level and a logic low level, the control signal (GCS) of the dual conversion gain transistor DCG should always remain at a logic high level not only in a time period (T1, etc.) for removing charges accumulated through the reset transistor RX, but also in a time period (T4, etc.) for transmitting photocharges of the floating diffusion (FD) regions to the sensing node SN. In some implementations, as shown in FIG. 6, in the first mode (Bayer mode), the control signal GCS for the dual conversion gain transistor DCG may always remain at a logic high level.

Since the control signal GCS for the dual conversion gain transistor DCG remains at a logic high level, four floating diffusion (FD) regions FD11, FD13, FD2R, and FD2G can remain electrically connected to the sensing node SN.

In the third period T3, the control signal TX11B for the first transfer transistors may have a logic high level, and may then be applied to the first transfer transistors. Since the control signal TX11B has a logic high level, photocharges generated by the photoelectric conversion element PD1B can be transferred to the floating diffusion (FD) regions FD11, FD13, FD2G, and FD2R in the second period T2.

In the fourth period T4, photocharges temporarily stored in the floating diffusion (FD) regions FD11, FD13, FD2R, and FD2G can be transferred to the sensing node SN. Since the control signal GCS for the dual conversion gain transistor DCG remains at a logic high level during the first mode (Bayer mode), the floating diffusion (FD) regions FD11, FD13, FD2R, and FD2G can be coupled to the sensing node SN. Photocharges applied to the sensing node SN may be transferred to a gate terminal of the drive transistor DX, such that a signal obtained by the amplified voltage can be read out.

In the remaining fifth to seventeenth periods T5 to T17, although the image sensing device 100 may operate in a similar way to the above-mentioned first to fourth periods T1 to T4, the control signals TX11GB, TX11GR, and TX11R of different first transfer transistors may remain at a logic high level in the seventh period T7, the eleventh period T11, and the fifteenth period T15. In more detail, the control signal TX11GB may remain at a logic high level in the seventh period T7, the control signal TX11GR may remain at a logic high level in the eleventh period T11, and the control signal TX11R may remain at a logic high level in the fifteenth period T15. As a result, photocharges generated by the photoelectric conversion elements PD1GB, PD1GR, and PD1R can be transferred to the floating diffusion (FD) regions FD11, FD13, FD2G, and FD2R in the above-mentioned time periods.

In the first Bayer pixel group PG11 based on some implementations of the disclosed technology, the order of reading signals may be changed to another order, and the scope or spirit of the disclosed technology is not limited thereto.

Referring to the timing diagram of the second mode (4SUM mode) shown in FIG. 7, when the image sensing device 100 operates the second mode (4SUM mode), a time period of the operation for generating and outputting signals from the pixels of the first 4SUM pixel group PG2R can be briefly classified into first to fifth periods T1 to T5.

In the first period T1, each of control signals TX1, TX21R, TX22R, TX23R, TX24R, RST, and GCS for the transistors may have a logic high level (where TX1 denotes TX11GB, TX11B, TX11GR, and TX11R). As a result, in the first period T1, charges accumulated in all the electrically connected constituent elements can be removed through the reset transistor RX.

The image sensing device 100 based on some implementations of the disclosed technology removes charges accumulated in the circuits during the first period T1 Thereafter, the amount of photocharges accumulated in each of the first 4SUM pixel group PG2R can be correctly measured.

In the second period T2, control signals TX21R, TX22R, TX23R, TX24R, and TX1 for the transfer transistors and the control signal RST for the reset transistor RX may remain at a logic low level, such that photocharges can be accumulated in each of the photoelectric conversion elements PD21R, PG22R, PD23R, and PD24R contained in the pixel array. As described above, each of the photoelectric conversion elements PD21R, PG22R, PD23R, and PD24R may include a photodiode, etc.

In the third period T3, the control signals TX21R TX22R, TX23R, and TX24R for the second transfer transistors TR21R, TR22R, TR23R, and TR24R may simultaneously have a logic high level. Since the control signals TX21R, TX22R, TX23R, and TX24R for the second transfer transistors are simultaneously applied, photocharges generated by the unit pixels can be simultaneously transferred to the 4SUM floating diffusion (FD) regions FD2R and FD2G during the second period T2.

In the third period T3 and the fourth period T4, all photocharges generated by the first 4SUM pixel group PG2R may be transferred to and temporarily stored in the 4SUM floating diffusion (FD) regions FD2R and FD2G.

In the fourth period T4 of the second mode (4SUM mode), the image sensing device 100 based on some implementations of the disclosed technology may enable the control signal GCS of the dual conversion gain transistor DCG to have a logic low level, such that the control signal GCS having a logic low level can be applied to the dual conversion gain transistor DCG. Since the Bayer floating diffusion (FD) regions FD11 and FD13 are coupled to the sensing node SN by the dual conversion gain transistor DCG, photocharges temporarily stored in the 4SUM floating diffusion (FD) regions FD2R and FD2G can be transferred to the sensing node SN in a situation in which the control signal GCS is not applied to the dual conversion gain transistor DCG.

In the fourth period T4, photocharges temporarily stored in the 4SUM floating diffusion (FD) regions FD2R and FD2G may be transferred to the sensing node SN, such that signals can be read out. Thereafter, in the fifth period T5, in order to sense the next period of the fifth period T5, all the circuits can be reset again.

That is, in the second mode (4SUM mode), the image sensing device 100 based on some implementations of the disclosed technology may selectively activate the dual conversion gain transistor DCG, and may change capacitance of the sensing node SN according to activation or deactivation of the dual conversion gain transistor DCG, such that two different signals can be read out in the second mode (4SUM mode).

The second mode (4SUM mode) in which the dual conversion gain transistor DCG is activated will hereinafter be described with reference to the timing diagram of the second mode low-noise (4SUM mode low-noise) operation shown in FIG. 8.

Referring to the timing diagram of the second mode low-noise operation (4SUM mode low-noise) shown in FIG. 8, when the image sensing device 100 operates in the second mode low-noise operation (4SUM mode low-noise), a time period of the operation for generating and outputting signals from the pixels of the first 4SUM pixel group PG2R can be briefly classified into first to fifth periods T1 to T5.

In the first period T1, each of control signals TX1, TX21R, TX22R, TX23R, TX24R, RST, and GCS for the transistors may have a logic high level (where TX1 denotes TX11GB, TX11B, TX11GR, and TX11R). Therefore, in the first period T1, charges accumulated in all the constituent elements contained in the electrically connected circuits can be removed through the reset transistor RX. The image sensing device 100 based on some implementations of the disclosed technology removes charges accumulated in the first period T1. Thereafter, the amount of photocharges accumulated in the first 4SUM pixel group PG2R can be correctly measured.

In the second mode low-noise operation (4SUM mode low-noise), the dual conversion gain transistor DCG may always remain activated while the image sensing device 100 operates. That is, the control signal GCS for the dual conversion gain transistor DCG may always remain at a logic high level.

Since the control signal GCS for the dual conversion gain transistor DCG remains at a logic high level, four floating diffusion (FD) regions FD11, FD13, FD2R, and FD2G can remain connected to the sensing node SN.

In the second period T2, the control signals TX21R, TX22R, TX23R, TX24R, and TX1 of the transfer transistors and the control signal RST of the reset transistor RX may remain at a logic low level, such that photocharges can be accumulated in each of the photoelectric conversion elements PD21R, PG22R, PD23R, and PD24R contained in the pixel array. In the second mode (4SUM mode), all the second transfer transistors TR21R, TR22R, TR23R, and TR24R are simultaneously activated (turned on) within one period, such that the amount of noise can also increase four times.

In the third period T3, the control signals TX21R, TX22R, TX23R, and TX24R for the second transfer transistors may simultaneously have a logic high level. Since the control signals TX21R, TX22R, TX23R, and TX24R for the second transfer transistors may simultaneously have a logic high level, all the photocharges generated by the first 4SUM pixel group PG2R can be transmitted to and temporarily stored in the floating diffusion (FD) regions FD11, FD13, FD2R, and FD2G in the third period T3.

In the fourth period T4, the photocharges temporarily stored in the floating diffusion (FD) regions FD11, FD13, FD2R, and FD2G can be transmitted to the sensing node SN. In the second mode low-noise operation (4SUM mode low-noise), the control signal GCS for the dual conversion gain transistor DCG may remain at a logic high level, the sensing node SN may be coupled to the floating diffusion (FD) regions FD11, FD13, FD2R, and FD2G, such that capacitance of the sensing node SN may increase and the signal can be robust to noise. The photocharges applied to the sensing node SN may be transferred to the gate terminal of the drive transistor DX, such that signals obtained by the amplified voltage can be read out. In addition, in the fifth period T5, the entire circuit can be reset to sense the next period.

In the second mode (4SUM mode), a first sensing operation in which the dual conversion gain transistor DCG is deactivated and a second sensing operation in which the dual conversion gain transistor DCG is activated may be carried out during only one period. Referring to the timing diagram of the second mode combination operation (4SUM mode combination) based on two measurement methods shown in FIG. 9, the measurement operation in which the control signal GCS of the dual conversion gain transistor DCG is activated and the measurement operation in which the control signal GCS of the dual conversion gain transistor DCG is not activated can be performed in one period corresponding to the time periods T1 to T9.

In comparison with FIG. 8, FIG. 9 illustrates that only the control signal GCS of the dual conversion gain transistor DCG is configured to operate at different time points. Referring to the seventh to ninth periods T7~T9 shown in FIG. 9, the control signal GCS of the dual conversion gain transistor DCG and the control signals TX21R, TX22R, TX23R, and TX24R of the second transfer transistors TX21R, TX22R, TX23R, and TX24R may be simultaneously activated, and may remain activated until reaching the ninth period T9.

Since the dual conversion gain transistor DCG is activated in the seventh to ninth periods T7~T9, the floating diffusion (FD) regions coupled to the sensing node SN can be maintained as the Bayer floating diffusion (FD) regions and the 4SUM floating diffusion (FD) regions FD11, FD13, FD2R, and FD2G, such that increased capacitance of the sensing node SN can be maintained.

The image processor 200 based on some implementations of the disclosed technology may process high-quality images using two signals that are obtained by controlling the dual conversion gain transistor DCG of the image sensing device 100.

For example, first signal information sensed in a situation in which the control signal GCS of the dual conversion gain transistor DCG has a logic low level may be compared with second signal information sensed in a situation in which the control signal GCS has a logic high level, such that a common mode signal caused by noise can be calculated and a value of such noise can be corrected. As a result, high-quality image information can be obtained.

Although the above-mentioned embodiment has been focused on the first Bayer pixel group PG11 and the first 4SUM pixel group PG2R for convenience of description, it should be noted that the same scheme as described above can also be applied to other pixel groups.

Figure 10:
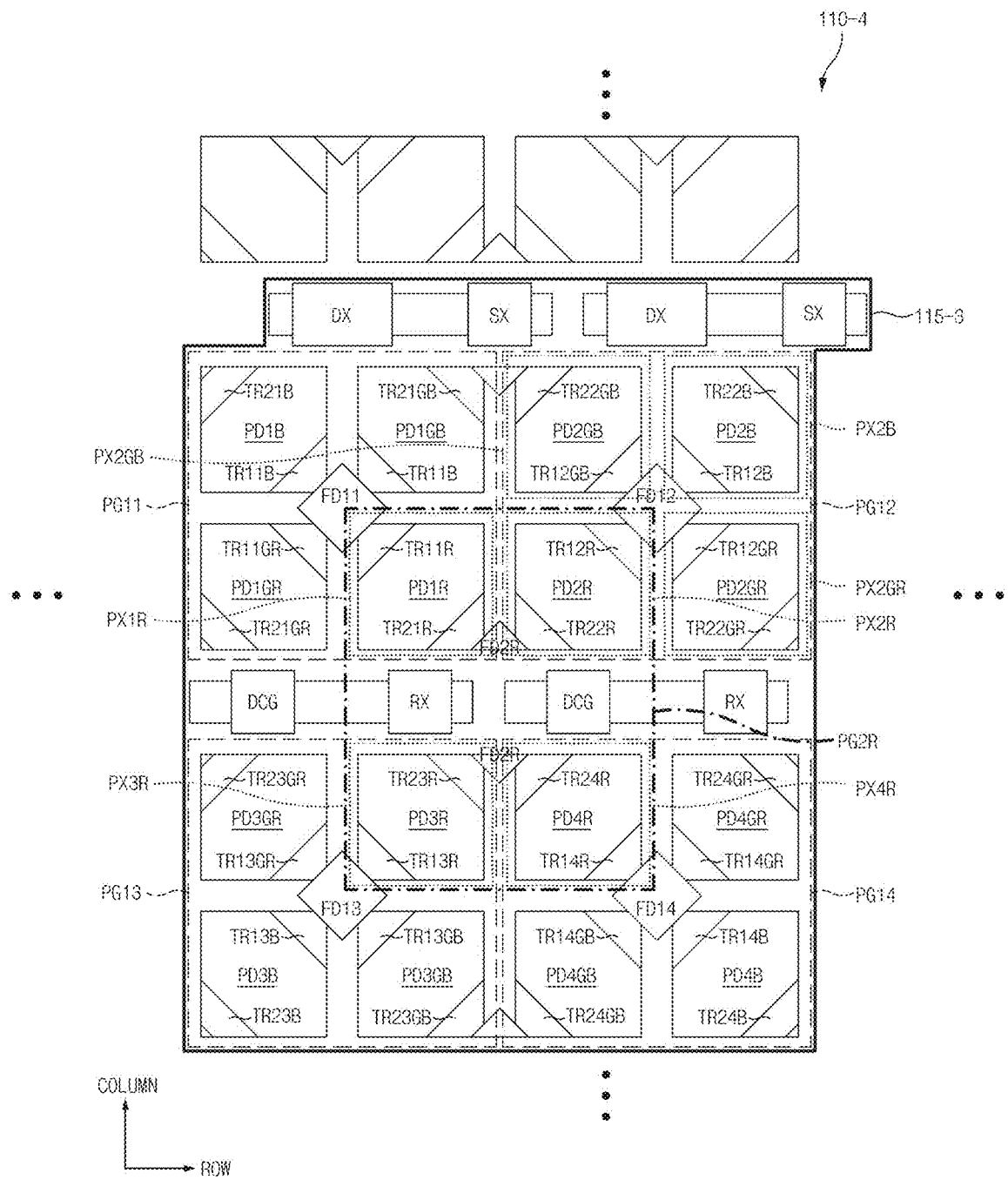
FIG. 10 is a layout diagram illustrating a pixel block, pixel groups, and transistors in an image sensing device based on some implementations of the disclosed technology.

FIG. 10 is a layout diagram illustrating a pixel block, pixel groups, and transistors for use in an image sensing device based on some implementations of the disclosed technology.

For convenience of description, the discussion here will focus on one group PG12 from among the Bayer pixel groups and one group PG2R from among the 4SUM pixel groups by way of example.

As previously described with reference to FIG. 3, the pixel block 115-3 in the pixel array 110-4 of the image sensing device 100 based on some implementations of the disclosed technology may include unit pixels (PX2B, PX2GB, PX2GR, PX2R, PX3R, PX4R, etc.), a drive transistor DX, a selection transistor SX, a reset transistor RX, and a dual conversion gain transistor DCG.

The drive transistors (DX), the selection transistors (SX), the reset transistors (RX), and the dual conversion gain transistors (DCG) may be shared by the pixel groups (PG11, PG2R, etc.), such that the above transistors may be used as shared transistors. Similarly to FIG. 3, in the pixel block 115-3, one region (i.e., a first shared transistor region and a second shared transistor region) in which shared transistors are disposed and the other region (i.e., a first pixel region and a second pixel region) in which unit pixels are disposed may be alternately arranged.

The first shared transistor region of the pixel block 115-3 may include two drive transistors (DX) and two selection transistors (SX). The second shared transistor region of the pixel block 115-3 may include two dual conversion gain transistors (DCG) and two reset transistors (RX).

The layout diagram of the pixel groups contained in the pixel block 115-3 shown in FIG. 10 may be substantially identical to those of FIG. 3. Therefore, the arrangement structure of the unit pixels, the floating diffusion (FD) regions, and the transfer transistors of the pixel group can be the same as those discussed above.

As previously described in FIG. 3, there is a need for the floating diffusion (FD) region to be shared in a single pixel group, and there is a need for photocharges applied to the floating diffusion (FD) region to be sensed and processed by the shared transistors DX, SX, RX, and DCG in the single pixel group, such that the positions of the shared transistors of the first transistor region and the second transistor region may be changed according to the arrangement structure of the Bayer floating diffusion (FD) regions and the 4SUM floating diffusion (FD) regions.

In some implementations, two Bayer floating diffusion (FD) regions FD12 and FD14 and two 4SUM floating diffusion (FD) regions FD2R and FD2G (see FIG. 11) may share one drive transistor DX, one selection transistor SX, one dual conversion gain transistor DCG, and one reset transistor RX from among the shared transistors contained in the pixel block 115-2.

In this case, transistors are arranged in a manner that two 4SUM floating diffusion (FD) regions FD2R and FD2G (see FIG. 11) are coupled to one terminal of the dual conversion gain transistor DCG and each of two Bayer floating diffusion (FD) regions FD12 and FD14 are coupled to a gate terminal of the drive transistor DX, such that the shared transistors may be arranged in the first transistor region and the second transistor region as shown in FIG. 10. The connection relationship between the floating diffusion (FD) regions and the shared transistors will hereinafter be described in detail with reference to FIG. 11.

Figure 11:
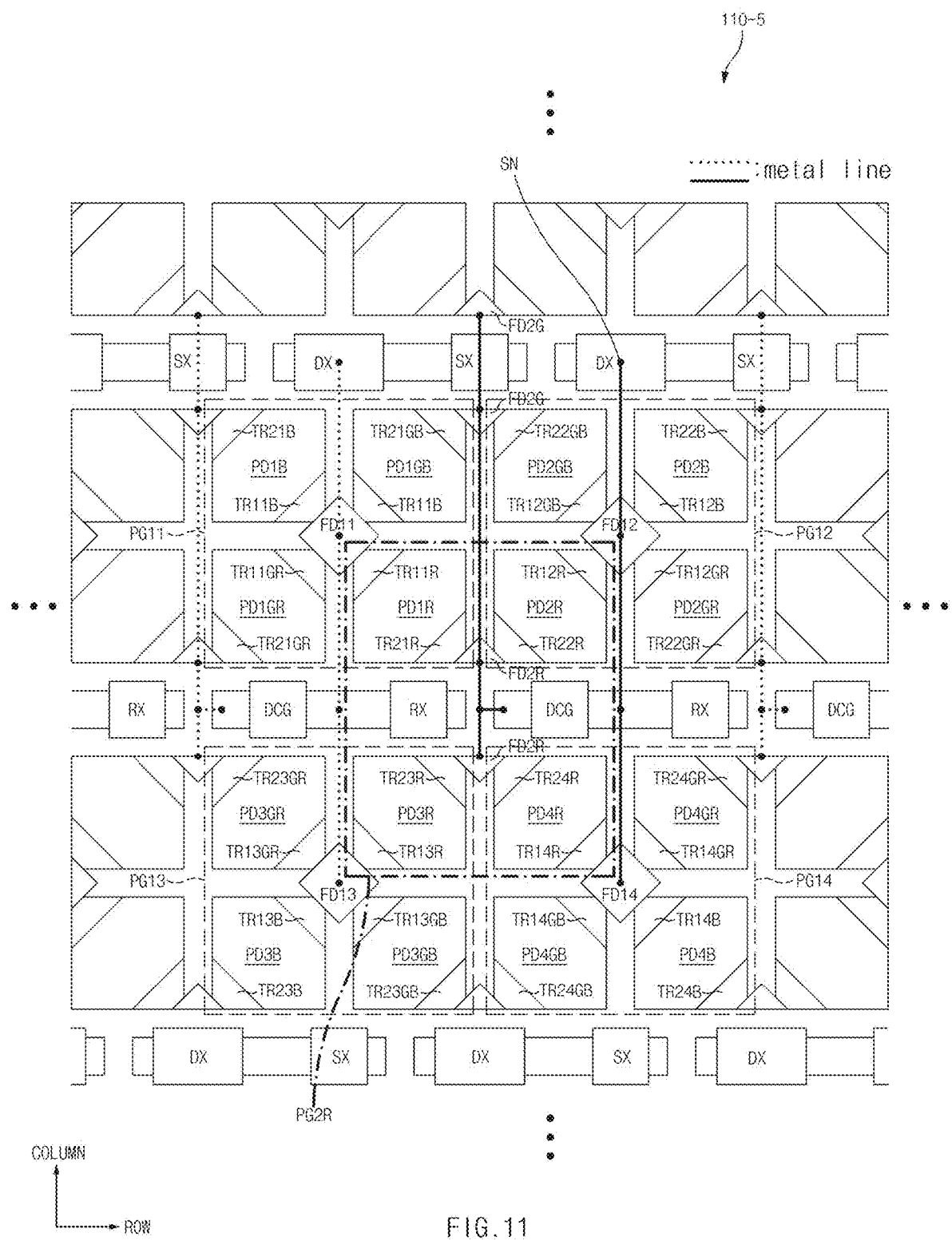
FIG. 11 is a layout diagram illustrating the connection relationship between pixel groups and transistors in the image sensing device based on some implementations of the disclosed technology.

FIG. 11 is a layout diagram illustrating the connection relationship between pixel groups and transistors for use in the image sensing device 100 based on some implementations of the disclosed technology.

FIG. 11 briefly illustrates metal lines of the image sensing device 100 based on some implementations of the disclosed technology.

Since the conductive lines such as metal lines are repeatedly arranged in the image sensing device 100, the discussion on the image sensing device 100 will focus on conductive lines (i.e., metal lines) denoted by solid lines. For the purposes of easy distinction, the repeated conductive lines are denoted by dotted lines.

In some implementations, the metal lines acting as the conductive lines can be coupled to each other in a manner that two Bayer floating diffusion (FD) regions FD12 and FD14 and two 4SUM floating diffusion (FD) regions FD2R and FD2G are configured to share the drive transistor DX, the selection transistor SX, the dual conversion gain transistor DCG, and the reset transistor RX.

In the same manner as in FIG. 4, in order to distinguish the 4SUM floating diffusion (FD) region FD2G shown in FIG. 11 from the first 4SUM floating diffusion (FD) region FD2R, the 4SUM floating diffusion (FD) region FD2G shown in FIG. 11 will hereinafter be referred to as a second 4SUM floating diffusion (FD) region FD2G.

In some implementations, the first 4SUM floating diffusion (FD) region FD2R and the second 4SUM floating diffusion (FD) region FD2G may be coupled to one terminal of the dual conversion gain transistor DCG through metal lines. The other terminal of the dual conversion gain transistor DCG may be coupled to the second Bayer floating diffusion (FD) region FD12 and the fourth Bayer floating diffusion (FD) region FD14 through metal lines.

The Bayer floating diffusion (FD) regions FD12 and FD14 coupled to the dual conversion gain transistor DCG may be coupled to the sensing node SN, and the sensing node SN may be coupled to the gate terminal of the drive transistor DX.

The image sensing device 100 based on some implementations of the disclosed technology may perform different specified operations in two different modes.

The respective modes may be changed according to the image capturing environment of the image sensing device 100, and the control register 170 may be controlled by the image processor 200, such that a method for operating the transistors in each of the operation modes can be decided. A method for determining the operation of the transistors for each mode according to the image capturing environment by referring to image information captured by the image sensing device 100 may be substantially identical to those of FIG. 4.

However, the image sensing device 100 based on some implementations of the disclosed technology can determine whether to operate the dual conversion gain transistor DCG in a high-illuminance environment, such that a high dynamic range can be acquired.

In the first mode (Bayer mode) corresponding to one of two modes, the first transfer transistors TR12GB, TR12B, TR12GR, and TR12R may be activated and operated at different time points. In this case, the second transfer transistors TR21R, TR22R, TR23R, and TR24R may be deactivated.

The first mode (Bayer mode) may refer to the high-illuminance environment having the sufficient amount of reception (Rx) light, and may denote an exemplary case in which the amount of photocharges generated by each pixel is larger than those of the low-illuminance environment.

The photoelectric conversion elements PD2GB, PD2B, PD2R, and PD2GR contained in the second Bayer pixel group PG12 may be coupled to the second Bayer floating diffusion (FD) region FD12 by the first transfer transistors TR12GB, TR12B, TR12R, and TR12GR.

Since the second Bayer floating diffusion (FD) region FD12 is electrically coupled to the fourth Bayer floating diffusion (FD) region FD14, the Bayer floating diffusion (FD) regions FD12 and FD14 may receive photocharges generated by the photoelectric conversion elements PD2GB, PD2B, PD2R, and PD2GR through the first transfer transistors TR12GB, TR12B, TR12R, and TR12GR.

As described above, the first 4SUM floating diffusion (FD) region FD2R may be coupled to the dual conversion gain transistor DCG and the second 4SUM floating diffusion (FD) region FD13 through metal lines. Since the dual conversion gain transistor DCG, the second Bayer floating diffusion (FD) region FD12, and the fourth Bayer floating diffusion (FD) region FD14 are coupled to the sensing node SN, four floating diffusion (FD) regions FD12, FD14, FD2R, and FD2G may be coupled in parallel to the sensing node SN. Parallel connection between the floating diffusion (FD) regions FD12, FD14, FD2R, and FD2G may indicate that junction capacitors are electrically coupled in parallel to each other.

In association with the connection relationship between metal lines, in order to sense photocharges generated by the first 4SUM pixel group PG2R in the second mode (4SUM mode), the dual conversion gain transistor DCG should be activated. In this case, capacitance other than parasitic capacitance of the sensing node SN may be identical to a total sum of capacitances of the above four floating diffusion (FD) regions FD12, FD14, FD2R, and FD2G. In other words, in the second mode (4SUM mode), the dual conversion gain transistor DCG may always remain activated, and a detailed description thereof will hereinafter be given with reference to FIG. 12.

The photoelectric conversion elements PD2GB, PD2B, PD2R, and PD2GR of the second Bayer pixel group PG12 may be coupled to the second Bayer floating diffusion (FD) region FD12 by the first transfer transistors TR12GB, TR12B, TR12R, and TR12GR. The second Bayer floating diffusion (FD) region FD12 may be electrically coupled to the fourth Bayer floating diffusion (FD) region FD14 through metal lines acting as conductive lines. The Bayer floating diffusion (FD) regions FD12 and FD14 may be directly coupled to the sensing node SN, such that the Bayer floating diffusion (FD) regions FD12 and FD14 can contribute to capacitance of the sensing node SN.

Since the second Bayer floating diffusion (FD) region FD12 is electrically coupled to the fourth Bayer floating diffusion (FD) region FD14, the Bayer floating diffusion (FD) regions FD12 and FD14 may receive photocharges generated by the photoelectric conversion elements PD2GB, PD2B, PD2R, and PD2GR through the first transfer transistors TR12GB, TR12B, TR12R, and TR12GR. The second Bayer floating diffusion (FD) region FD12 and the fourth Bayer floating diffusion (FD) region FD14 may operate like as a single floating diffusion (FD) region in the connection relationship between the constituent elements of the embodiment shown in FIG. 10.

In the first mode (Bayer mode), whereas photocharges can be sensed irrespective of activation of the dual conversion gain transistor DCG, information about whether generated photocharges will be transferred to the 4SUM floating diffusion (FD) regions FD2R and FD2G can be determined based on activation or deactivation of the dual conversion gain transistor DCG. That is, in the first mode (Bayer mode), the connection relationship between the sensing node SN and the floating diffusion (FD) regions may be changed according to activation or deactivation of the dual conversion gain transistor DCG. In other words, in the first mode (Bayer mode), the dual conversion gain transistor DCG may be activated to change capacitance of the sensing node SN.

In the first mode (Bayer mode), the image sensing device 100 may control activation or deactivation of the dual conversion gain transistor DCG so as to increase capacitance of the sensing node SN, such that total capacitance of the sensing node SN can be adjusted in the first mode (Bayer mode).

The floating diffusion (FD) regions FD12, FD14, FD2R, and FD2G may temporarily store and accumulate the received photocharges. The signal corresponding to a voltage of the accumulated photocharges may be transferred to the sensing node SN, and the signal applied to the sensing node SN may be amplified and sensed by the drive transistor DX disposed in the first shared transistor region.

In more detail, a gate electrode of the drive transistor DX may receive photocharges temporarily stored in the floating diffusion (FD) regions FD12, FD14, FD2R, and FD2G through the sensing node SN. The drive transistor DX may output a power-supply voltage based on the received photocharges to the selection transistor SX. The selection transistor SX may transmit an output voltage of the drive transistor DX to an output port.

The dual conversion gain transistor DCG disposed in the second shared transistor region may be activated or deactivated according to the respective modes.

The reset transistor RX disposed in the second shared transistor region may reset each of the floating diffusion (FD) regions FD12, FD14, FD2R, and FD2G and each of the photoelectric conversion elements PD2GB, PD2B, PD2GR, PD1R, PD2R, PD3R, PD4R, etc. to the power-supply voltage level.

The transistors DX, SX, DCG, and RX disposed in each of the first shared transistor region and the second shared transistor region may be arranged in different arrangement shapes according to how the transistors DX, SX, DCG, and RX are shared in the pixel array 110-5 or according to how the metal lines such as conductive lines are arranged in the pixel array 110-5.

Figure 12:
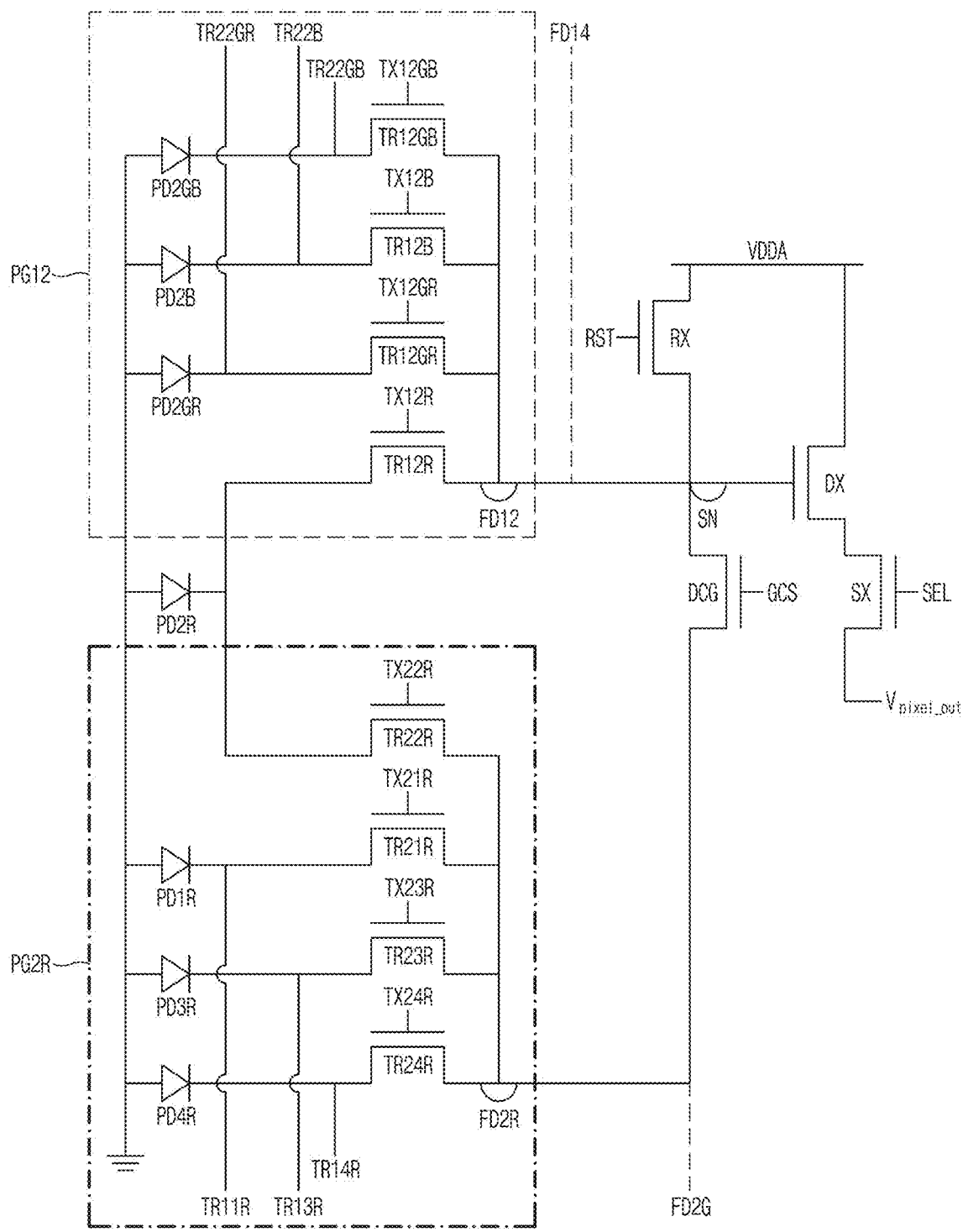
FIG. 12 is a conceptual equivalent circuit illustrating some pixel groups shown in FIG. 11 based on some implementations of the disclosed technology.

FIG. 12 is a conceptual equivalent circuit illustrating some pixel groups shown in FIG. 11.

Since the image sensing device 100 is configured in a manner that the constituent elements of the entire pixel array 110-5 are arranged in the repeated arrangement structure, the discussion below will focus on an equivalent circuit of the second Bayer pixel group PG12 and the first 4SUM pixel group PG2R for convenience of description.

Unit pixels contained in each of the pixel groups may be shared by other pixel groups other than the second Bayer pixel group PG12 and the first 4SUM pixel group PG2R. However, as can be seen from FIG. 12, in the case of using transistors not contained in the second Bayer pixel group PG12 and transistors not contained in the first 4SUM pixel group PG2R, only names of connected transistors are illustrated in FIG. 12 for convenience of description. In addition, as can be seen from FIG. 12, four floating diffusion (FD) regions FD12, FD14, FD2R, and FD2G may be coupled to the single sensing node SN, such that the connection relationship between the four floating diffusion (FD) regions FD12, FD14, FD2R, and FD2G with respect to the sensing node SN will be briefly illustrated.

Referring to FIG. 12, the image sensing device 100 may include pixel groups (PG11, PG2R, etc.), the dual conversion gain transistor DCG, the sensing node SN, the drive transistor DX, the selection transistor SX, and the reset transistor RX.

Photocharges accumulated in the respective photoelectric conversion elements PD2GB, PD2B, PD2GR, PD1R, PD2R, PD3R, and PD4R may be transferred to the floating diffusion (FD) regions FD12, FD14, FD2R, and FD2G through transistors to be activated for each mode.

The transfer transistors (TR12GB, TR12B, TR12GR, etc.) may be turned on according to the respective transfer control signals (TX12GB, TX12B, TX12GR, etc.) applied to gate terminals of the transfer transistors, such that photocharges accumulated in the photoelectric conversion elements PD2GB, PD2B, PD2GR, PD1R, PD2R, PD3R, and PD4R can be transferred to the floating diffusion (FD) regions FD12, FD14, FD2R, and FD2G.

In the first mode (Bayer mode), the image sensing device 100 based on some implementations of the disclosed technology may independently transmit charges accumulated in the photoelectric conversion elements PD2GB, PD2B, PD2GR, and PD2R to the floating diffusion (FD) regions FD12, FD14, FD2R, and FD2G through the first transfer transistors TR12GB, TR12B, TR12GR, and TR12R.

In the first mode (Bayer mode), in order to independently transmit photocharges accumulated in each photoelectric conversion element, the transfer control signals TX12GB, TX12B, TX12GR, and TX12R for the first transfer transistors TR12GB, TR12B, TR12GR, and TR12R may be applied at different time points.

In other words, in the first mode (Bayer mode), the floating diffusion (FD) regions FD12, FD14, FD2R, and FD2G may separately receive charges accumulated in the photoelectric conversion elements PD2GB, PD2B, PD2GR, and PD2R of each unit pixel, such that the sensing node SN can independently sense and detect the charges accumulated in each of the photoelectric conversion elements PD2GB, PD2B, PD2GR, and PD2R.

Therefore, in the first mode (Bayer mode), photocharges generated by each of the photoelectric conversion elements PD2GB, PD2B, PD2GR, and PD2R of the first Bayer pixel group PG12 can be independently sensed for each unit pixel.

In the first mode (Bayer mode), the sensing node SN may separately sense and detect charges accumulated in each of the photoelectric conversion elements PD2GB, PD2B, PD2R, and PD2GR, such that images can be processed using the sensed charges.

In some implementations, in the first mode (Bayer mode), capacity of the floating diffusion (FD) region receiving photocharges may be changed according to activation or deactivation of the dual conversion gain transistor DCG. That is, when the dual conversion gain transistor DCG is deactivated, total capacity of the floating diffusion (FD) region may be denoted by the sum of capacity of the second Bayer floating diffusion (FD) region FD12 and capacity of the fourth Bayer floating diffusion (FD) region FD14G. In contrast, when the dual conversion gain transistor DCG is activated, total capacity of the floating diffusion (FD) region receiving photocharges may be denoted by the sum of capacity of the second Bayer floating diffusion (FD) region FD12, capacity of the fourth Bayer floating diffusion (FD) region FD14, capacity of the first 4SUM floating diffusion (FD) region FD2R, and capacity of the second 4SUM floating diffusion (FD) region FD2G. The dual conversion gain transistor DCG may be activated when the gain conversion control signal (GCS) applied to the gate terminal of the dual conversion gain transistor DCG is at a logic high level.

In contrast, in the second mode (4SUM mode), the image sensing device 100 based on some implementations of the disclosed technology may activate the dual conversion gain transistor DCG to sense photocharges generated by the photoelectric conversion elements PD1R, PD2R, PD3R, and PD4R of the first 4SUM pixel group PG2R. That is, there is a need for the dual conversion gain transistor DCG to be activated in the second mode (4SUM mode).

The drive transistor DX illustrated as a source follower amplifier may amplify a change in electrical potential of the sensing node SN coupled to the floating diffusion (FD) regions FD12, FD14, FD2R, and FD2G having received the photocharges, and may transmit the amplified change in electrical potential to the selection transistor SX.

In each of the first mode (Bayer mode) and the second mode (4SUM mode), photocharges applied to the sensing node SN may be transferred to the gate terminal of the drive transistor DX, such that the resultant photocharges can be amplified. In this case, the drive transistor DX may serve as a source follower. Thereafter, the amplified voltage may be output as an output voltage ($V_{pixel\_out}$) according to whether or not the control signal SEL for the selection transistor SX is applied.

Figure 13:
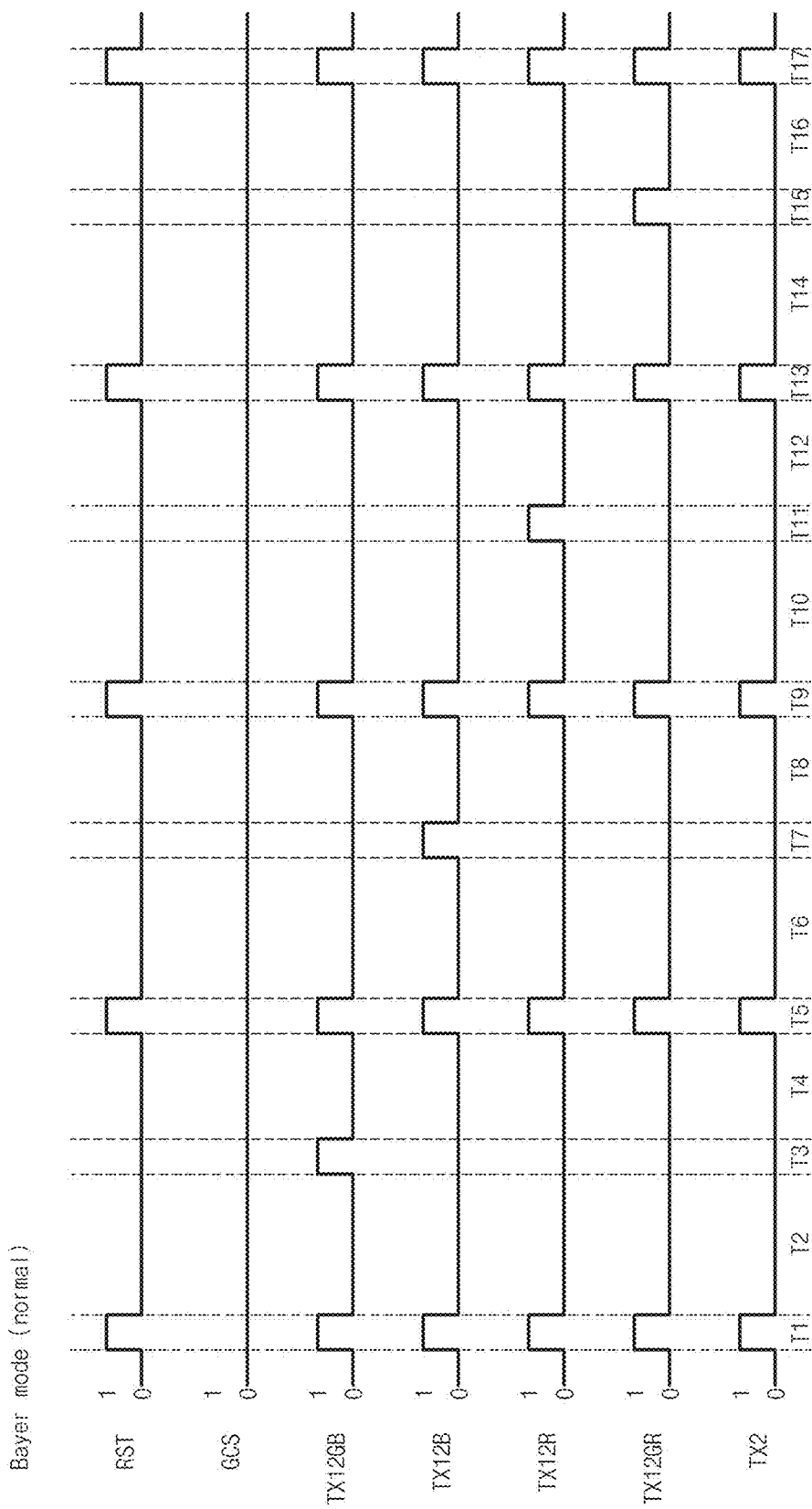
FIG. 13 is a timing diagram illustrating a method for controlling transistors in a first mode of the circuit shown in FIG. 12 based on some implementations of the disclosed technology.
Figure 14:
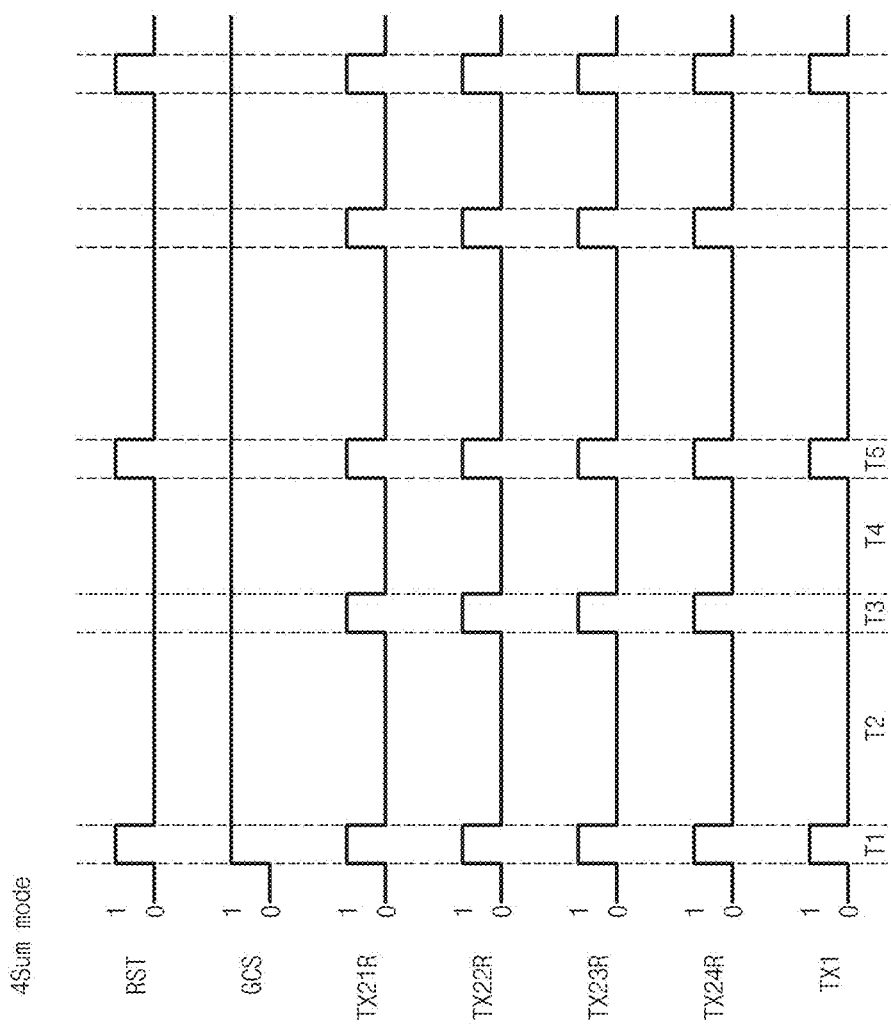
FIG. 14 is a timing diagram illustrating a method for controlling transistors in a second mode of the circuit shown in FIG. 12 based on some implementations of the disclosed technology.
Figure 15:
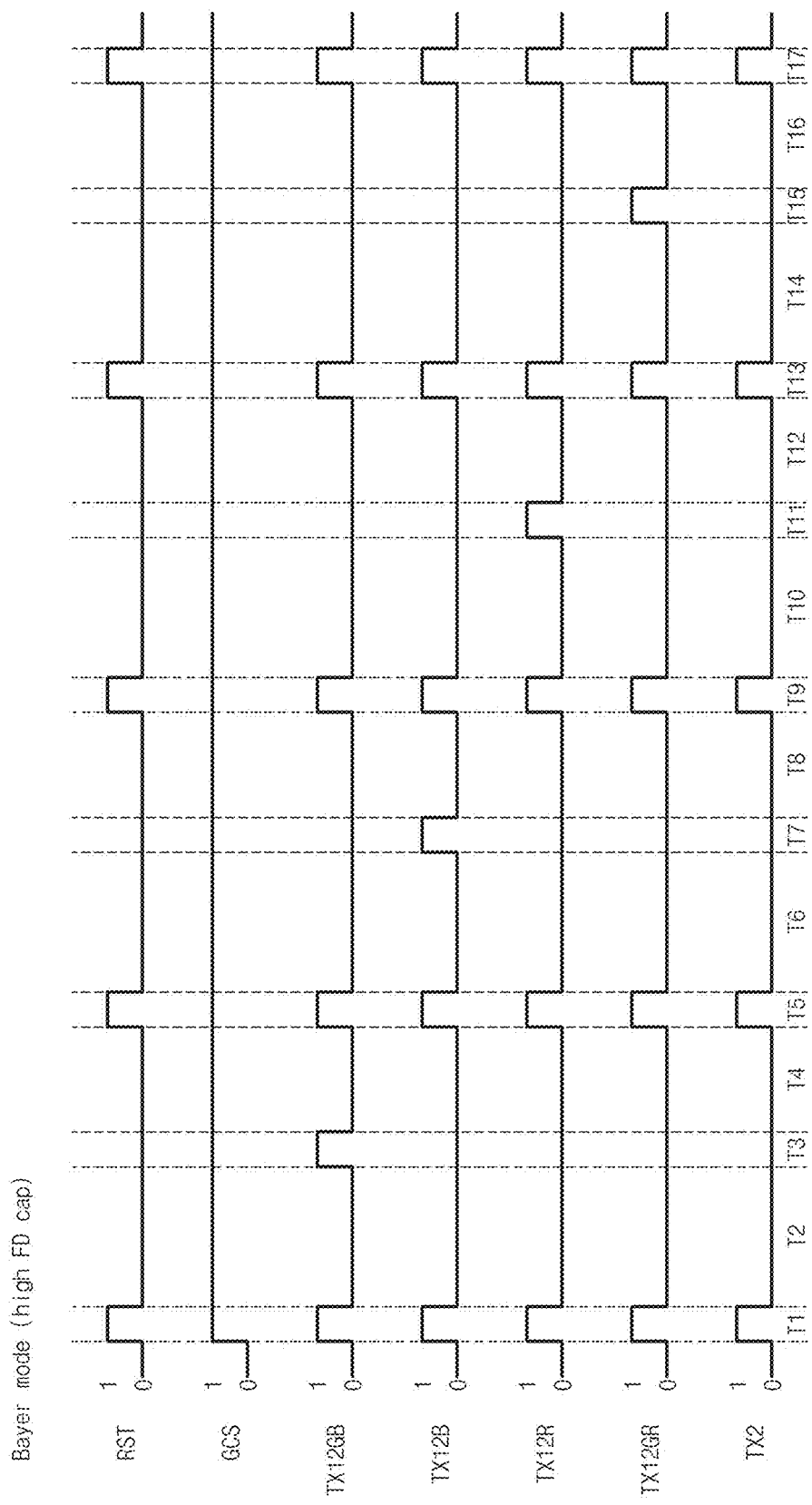
FIG. 15 is a timing diagram illustrating a method for controlling transistors in a high-luminous-intensity operation of the first mode of the circuit shown in FIG. 13 based on some implementations of the disclosed technology.

FIGS. 13 to 15 are timing diagrams illustrating methods for controlling transistors in the respective modes of the circuit shown in FIG. 12 based on some implementations of the disclosed technology. For convenience of description, the discussion below will focus on the second Bayer pixel group PG12 and the first 4SUM pixel group PG2R shown in FIG. 12.

In order to control the circuit shown in FIG. 12, control signals TX11GB, TX11B, TX11GR, TX11R, TX21R, TX22R, TX23R, TX24R, RST, and GCS respectively applied to transistors TR11GB, TR11B, TR11GR, TR11R, TR21R, TR22R, TR23R, TR24R, RX, and DCG contained in the pixel groups PG11 and PG2R are illustrated in FIG. 13.

The drive transistor DX and the selection transistor SX are operated as discussed above with reference to FIG. 12 and the operation in which the signal of the sensing node SN is applied to the gate terminal of the drive transistor DX and is then amplified may be equally carried out in all the modes can be operated as will be discussed below. By way of example, the control signal RST of the reset transistor RX, the control signal GCS of the dual conversion gain transistor DCG, and control signals TX12GB, TX12B, TX12GR, TX12R, TX22R, TX21R, TX23R, TX24R, RST, and GCS of the transfer transistors TR12GB, TR12B, TR12GR, TR12R, TR22R, TR21R, TR23R, and TR24R will be discussed for convenience of description.

Each of the control signals TX12GB, TX12B, TX12GR, TX12R, TX22R, TX21R, TX23R, TX24R, RST, and GCS may have two logic levels. For convenience of description, "1" may denote a logic high level of each signal, and "0" may denote a logic low level of each signal. That is, when the control signal having a logic high level is applied to the gate terminal of each transistor, the corresponding transistor may be activated (or turned on). When the control signal having a logic low level is applied to the gate terminal of each transistor, the corresponding transistor may be deactivated (turned off).

Referring to the timing diagram of the first mode (Bayer mode) shown in FIG. 13, when the image sensing device 100 performs capturing of the first mode (Bayer mode), a time period of the operation for generating and outputting signals from the pixels of the second Bayer pixel group PG12 can be briefly classified into first to seventeenth periods T1 to T17.

In the first period T1, each of control signals TX12GB, TX12B, TX12GR, TX12R, TX2, RST, and GCS for the transistors may have a logic high level (where TX2 denotes TX21R, TX22R, TX23R, and TX24R). Since each of the control signals has a logic high level, the remaining circuits other than the drive transistor DX and the selection transistor SX can be electrically coupled to each other. As a result, charges accumulated in the interconnected constituent elements can be removed through the reset transistor RX. Thereafter, the amount of photocharges accumulated in each of the photoelectric conversion elements can be correctly measured.

In the second period T2, control signals TX12GB, TX12B, TX12GR, TX12R, and TX2 for the transfer transistors and the control signal RST for the reset transistor RX may remain at a logic low level, such that photocharges can be accumulated in each of the photoelectric conversion elements PD12GB, PG12B, PD12GR, and PD12R contained in the pixel array. As described above, each of the photoelectric conversion elements PD12GB, PG12B, PD12GR, and PD12R may include a photodiode, etc.

In the third period T3, the control signal TX12GB for the first transfer transistors may have a logic high level, and may then be applied to the first transfer transistors. Since the control signal TX12GB has a logic high level, photocharges generated by the photoelectric conversion element PD12GB can be transferred to the floating diffusion (FD) regions FD12 and FD14 in the second period T2.

In the fourth period T4, photocharges temporarily stored in the Bayer floating diffusion (FD) regions FD12 and FD14 can be transferred to the sensing node SN.

Photocharges applied to the sensing node SN may be transferred to a gate terminal of the drive transistor DX, such that a signal obtained by the amplified voltage can be read out.

In the remaining fifth to seventeenth periods T5 to T17, although the image sensing device 100 may operate in a similar way to the above-mentioned first to fourth periods T1 to T4, the control signals TX12B, TX12R, and TX12GR of different first transfer transistors may remain at a logic high level in the seventh period T7, the eleventh period T11, and the fifteenth period T15. In more detail, the control signal TX12B may remain at a logic high level in the seventh period T7, the control signal TX12R may remain at a logic high level in the eleventh period T11, and the control signal TX12GR may remain at a logic high level in the fifteenth period T15. As a result, photocharges generated by the photoelectric conversion elements PD2B, PD2R, and PD2GR can be transferred to the floating diffusion (FD) regions FD12 and FD14 in the above-mentioned time periods.

In the second Bayer pixel group PG12 based on some implementations of the disclosed technology, the order of reading signals may be changed to another order, and the scope or spirit of the disclosed technology is not limited thereto.

Referring to the timing diagram of the second mode (4SUM mode) shown in FIG. 14, when the image sensing device 100 performs capturing of the second mode (4SUM mode), a time period of the operation for generating and outputting signals from the pixels of the first 4SUM pixel group PG2R can be briefly classified into first to fifth periods T1 to T5.

In the first period T1, each of control signals TX1, TX21R, TX22R, TX23R, TX24R, RST, and GCS for the transistors may have a logic high level (where TX1 denotes TX11GB, TX11B, TX11GR, and TX11R). As a result, in the first period T1, charges accumulated in all the electrically connected constituent elements can be removed through the reset transistor RX.

The image sensing device 100 based on some implementations of the disclosed technology removes charges accumulated in the circuits during the first period T1. Thereafter, the amount of photocharges accumulated in each of the first 4SUM pixel group PG2R can be correctly measured.

In the second period T2, control signals TX21R, TX22R, TX23R, TX24R, and TX1 for the transfer transistors and the control signal RST for the reset transistor RX may remain at a logic low level, such that photocharges can be accumulated in each of the photoelectric conversion elements PD21R, PG22R, PD23R, and PD24R of the pixels contained in the pixel array. As described above, each of the photoelectric conversion elements PD21R, PG22R, PD23R, and PD24R may include a photodiode, etc.

In the second mode (4SUM mode) based on some implementations of the disclosed technology, the dual conversion gain transistor DCG may always remain activated while the image sensing device 100 operates. That is, the control signal GCS for the dual conversion gain transistor DCG may always remain at a logic high level.

Since the control signal GCS for the dual conversion gain transistor DCG remains at a logic high level, four floating diffusion (FD) regions FD12, FD14, FD2R, and FD2G can remain connected to the sensing node SN.

In the third period T3, the control signals TX21R, TX22R, TX23R, and TX24R for the second transfer transistors TR21R, TR22R, TR23R, and TR24R may simultaneously have a logic high level. Since the control signals TX21R, TX22R, TX23R, and TX24R for the second transfer transistors are simultaneously applied, photocharges generated by the unit pixels can be simultaneously transferred to the 4SUM floating diffusion (FD) regions FD2R and FD2G during the second period T2.

In the third period T3 and the fourth period T4, all photocharges generated by the second pixel group PG2R may be transferred to and temporarily stored in the floating diffusion (FD) regions FD12, FD14, FD2R, and FD2G.

In the fourth period T4, photocharges may be transferred from the floating diffusion (FD) regions FD12, FD14, FD2R, and FD2G to the sensing node SN, such that signals are read out. In the fifth period T5, all the circuits may be reset again so as to sense the next period.

Referring to the timing diagram of a high-luminous-intensity operation of the first mode (Bayer mode high FD cap) shown in FIG. 15, when the image sensing device 100 operates in the first mode high-luminous-intensity environment (Bayer mode high FD cap), a time period of the operation for generating and outputting signals from the pixels of the second Bayer pixel group PG12 can be briefly classified into first to seventeenth periods T1 to T17.

In the first period T1, each of control signals TX12GB, TX1B, TX12R, TX12GR, TX2, RST, and GCS for the transistors may have a logic high level (where TX2 denotes TX21R, TX22R, TX23R, and TX24R). Therefore, in the first period T1, charges accumulated in all the constituent elements contained in the electrically connected circuits can be removed through the reset transistor RX. The image sensing device 100 based on some implementations of the disclosed technology removes charges accumulated in the first period T1. Thereafter, the amount of photocharges accumulated in the second Bayer pixel group PG12 can be correctly measured.

In the second period T2, control signals TX12GB, TX12B, TX12GR, TX12R, and TX2 for the transfer transistors and the control signal RST for the reset transistor RX may remain at a logic low level, such that photocharges can be accumulated in each of the photoelectric conversion elements PD12GB, PG12B, PD12R, and PD12GR contained in the pixel array. In the first mode high-luminous-intensity operation (Bayer mode high FD cap) based on other implementations of the disclosed technology, the dual conversion gain transistor DCG may always remain activated while the image sensing device 100 operates. That is, the control signal GCS for the dual conversion gain transistor DCG may always remain at a logic high level.

Since the control signal GCS of the dual conversion gain transistor DCG remains at a logic high level, four floating diffusion (FD) regions FD12, FD14, FD2R, and FD2G can remain connected to the sensing node SN. Since the floating diffusion (FD) regions FD12, FD14, FD2R, and FD2G are coupled to the sensing node SN, total capacitance of the sensing node SN may increase, such that high-quality images in which image quality is not deteriorated can also be acquired in the high-luminous-intensity (high FD cap) environment.

When the amount of incident light is excessively high in level, photocharges exceeding a threshold capacity value of the floating diffusion (FD) region may be introduced into the image sensing device, such that noise such as the blooming phenomenon may occur. Therefore, since the control signal GCS of the dual conversion gain transistor DCG remains at a logic high level, the connection state between the floating diffusion (FD) regions may be adjusted, such that a conversion gain of the sensing node SN can be controlled.

In the third period T3, the control signal TX12GB for each of the first transfer transistors may have a logic high level. Since the control signal TX12GB has a logic high level, photocharges generated by the unit pixels can be transferred to the floating diffusion (FD) regions FD12, FD14, FD2G, and FD2R during the second period T2.

In the fourth period T4, photocharges temporarily stored in the floating diffusion (FD) regions FD12, FD14, FD2R, and FD2G can be transferred to the sensing node SN. Since the control signal GCS for the dual conversion gain transistor DCG remains at a logic high level, the floating diffusion (FD) regions FD12, FD14, FD2R, and FD2G can be coupled to the sensing node SN. Photocharges applied to the sensing node SN may be transferred to the gate terminal of the drive transistor DX, such that the signal obtained by the amplified voltage can be read out.

In the remaining fifth to seventeenth periods T5 to T17, although the image sensing device 100 may operate in a similar way to the above-mentioned first to fourth periods T1 to T4, the control signals TX12B, TX12R, and TX12GR of different first transfer transistors may remain at a logic high level in the seventh period T7, the eleventh period T11, and the fifteenth period T15. In more detail, the control signal TX12B may remain at a logic high level in the seventh period T7, the control signal TX12R may remain at a logic high level in the eleventh period T11, and the control signal TX12GR may remain at a logic high level in the fifteenth period T15. As a result, photocharges generated by the photoelectric conversion elements PD2B, PD2R, and PD2GR can be transferred to the floating diffusion (FD) regions FD12, FD14, FD2G, and FD2R in the above-mentioned time periods.

In some implementations, the order of reading signals in the second Bayer pixel group PG12 may be changed to another order, and the scope or spirit of the disclosed technology is not limited thereto.

Although the discussions above focus on the second Bayer pixel group PG12 and the first 4SUM pixel group PG2R for convenience of description, it should be noted that the same scheme as described above can also be applied to other pixel groups.

Figure 16:
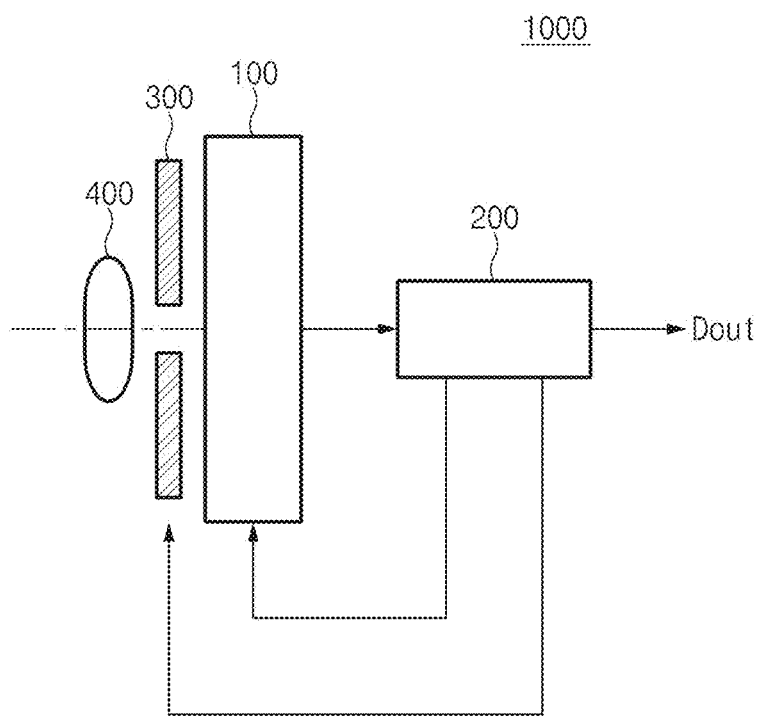
FIG. 16 is a schematic diagram illustrating an electronic device including the image sensing device based on some implementations of the disclosed technology.

FIG. 16 is a schematic diagram illustrating an electronic device 1000 including the image sensing device 100 based on some implementations of the disclosed technology. Referring to FIG. 16, the electronic device 1000 including the image sensing device 100 based on some implementations of the disclosed technology may be implemented as, for example, a camera capable of capturing still images or moving images, and the like. The electronic device 1000 may include an optical system 400 (or an optical lens), a shutter unit 300, and an image processor 200 that is configured to control/drive the image sensing device 100 and the shutter unit 300 as well as to perform signal processing of the image sensing device 100 and the shutter unit 300.

The optical system 400 may allow image light (incident light) from a target object to be introduced into the pixel array 110 (see FIG. 1) of the image sensing device 100. The optical system 400 may include a plurality of optical lenses. The shutter unit 300 may control a light illumination period and a light shielding period of the image sensing device 100.

The image processor 200 may control the transmission operation of the image sensing device 100 and the shutter operation of the shutter unit 300. In addition, the image processor 200 may process various kinds of signals for the output signals of the image sensing device 100. The image signal ($D_{out}$) obtained by such signal processing may be stored in a storage medium such as a memory, or may be output to a monitor or the like.

As is apparent from the above description, the image sensing device based on some implementations of the disclosed technology can allow an image to be captured in a low-illuminance environment.

In addition, the image sensing device based on some implementations of the disclosed technology can acquire a high dynamic range without introducing a separate capacitive element into a high-illuminance environment.

Only a few examples for implementing the disclosed technology are disclosed. Additional implementations can be made based on what is disclosed in this patent document,

What is claimed is:
1. An image sensing device comprising:
an imaging pixel array including a plurality of imaging pixels, each imaging pixel structured to detect incident light and to generate a pixel signal, the plurality of imaging pixels including (1) first imaging pixels that are grouped into a plurality of first pixel groups each first pixel group including different first imaging pixels at least one of which is in a different color from others, and (2) second imaging pixels that are grouped into a plurality of second pixel groups wherein each second pixel group include second imaging pixels in the same color;
a plurality of first floating diffusion regions disposed in the first pixel groups, respectively, each first floating diffusion region located at or near a center portion of, and surrounded by, the first imaging pixels in each first pixel group and coupled to receive photocharges from the first imaging pixels of each first pixel group;
a plurality of second floating diffusion regions disposed in the second pixel groups, respectively, each second floating diffusion region located at or near a center portion of, and surrounded by, second imaging pixels in each second pixel group; and
a sensing node coupled to at least one of the first floating diffusion regions to sense a signal of the at least one of the first floating diffusion regions and the sensing node coupled to at least one of the second floating diffusion regions to sense a signal of the at least one of the second floating diffusion regions; and
a dual conversion gain transistor coupled between the sensing node and at least one of first floating diffusion region and second floating diffusion region to produce different signal gains on a signal from the first floating diffusion region or the second floating diffusion region based on different levels of incident light.

2. The image sensing device according to claim 1, wherein the one of the first pixel groups and the one of the second pixel groups located adjacent to the one of the first pixel groups are configured to share one of the plurality of imaging pixels.

3. The image sensing device according to claim 1, further comprising:
- a drive transistor configured to amplify a signal received from the sensing node;
- a selection transistor configured to output the signal amplified by the drive transistor to a signal line; and
- a reset transistor configured to remove photocharges accumulated in each of the first floating diffusion (FD) regions, the second floating diffusion (FD) regions, and the sensing node,
- wherein the drive transistor, the selection transistor, and the reset transistor are shared by the one of the first pixel groups and the one of the second pixel groups.

4. The image sensing device according to claim 3, wherein:
- the dual conversion gain transistor, the drive transistor, the selection transistor, and the reset transistor are disposed in a shared transistor region located adjacent to a pixel region in which the imaging pixels are arranged, and
- the shared transistor region and the pixel region in which the imaging pixels are arranged are alternately arranged.

5. The image sensing device according to claim 4, wherein:
- the drive transistor and the selection transistor are disposed in a first shared transistor region; and
- the dual conversion gain transistor and the reset transistor are disposed in a second shared transistor region.

6. The image sensing device according to claim 5, wherein:
- each of the second floating diffusion regions is physically isolated by the first or second shared transistor region.

7. The image sensing device according to claim 3, wherein each imaging pixel contained in each of the first pixel groups or each imaging pixel contained in each of the second pixel groups includes:
- a photoelectric conversion element;
- a first transfer transistor coupled between one of the first floating diffusion (FD) regions and the photoelectric conversion element; and
- a second transfer transistor coupled between one of the second floating diffusion (FD) regions and the photoelectric conversion element.

8. The image sensing device according to claim 7, wherein the first transfer transistor and the second transfer transistor are diagonally disposed in each imaging pixel.

9. The image sensing device according to claim 7, wherein the first transfer transistors contained in each of the first pixel groups are disposed in a radial direction with respect to the corresponding first floating diffusion (FD) region.

10. The image sensing device according to claim 7, wherein the second transfer transistors contained in each of the second pixel groups are disposed in a radial direction with respect to the corresponding second floating diffusion (FD) region.

11. The image sensing device according to claim 7, wherein the dual conversion gain transistor is coupled to a corresponding first floating diffusion (FD) region through a first terminal of the dual conversion gain transistor and is coupled to a corresponding second floating diffusion (FD) region through a second terminal of the dual conversion gain transistor.

12. The image sensing device according to claim 11, wherein:
- the second terminal of the dual conversion gain transistor is coupled to the sensing node; and
- the sensing node is coupled to a gate terminal of the drive transistor and one terminal of the reset transistor.

13. The image sensing device according to claim 12, wherein:
- when photocharges temporarily stored in a corresponding first floating diffusion (FD) region are transferred to the sensing node, the dual conversion gain transistor is activated; and
- when photocharges temporarily stored in a corresponding second floating diffusion (FD) region are transferred to the sensing node, the dual conversion gain transistor is selectively activated according to a degree of noise.

14. The image sensing device according to claim 7, wherein the dual conversion gain transistor is coupled to a corresponding second floating diffusion (FD) region through a first terminal of the dual conversion gain transistor, and is coupled to a corresponding first floating diffusion (FD) region through a second terminal of the dual conversion gain transistor.

15. The image sensing device according to claim 14, wherein:
- the second terminal of the dual conversion gain transistor is coupled to the sensing node; and
- the sensing node is coupled to a gate terminal of the drive transistor and one terminal of the reset transistor.

16. The image sensing device according to claim 15, wherein:
- when photocharges temporarily stored in a corresponding second floating diffusion (FD) region are transferred to the sensing node, the dual conversion gain transistor is activated; and
- when photocharges temporarily stored in a corresponding first floating diffusion (FD) region are transferred to the sensing node, the dual conversion gain transistor is selectively activated according to an intensity of reception light applied to the imaging pixel.

17. The image sensing device according to claim 7, wherein:
- the first transfer transistors contained in each of the first pixel groups are activated at different time points so as to transfer photocharges generated by the photoelectric conversion element to the corresponding first floating diffusion (FD) region.

18. The image sensing device according to claim 7, wherein:
- the second transfer transistors contained in each of the second pixel groups are simultaneously activated so as to transfer photocharges generated by the photoelectric conversion element to the corresponding second floating diffusion (FD) region.

19. An image sensing device comprising:
- a plurality of imaging pixels arranged such that each imaging pixel belongs to both one of first pixel groups and one of second pixel group;
- a plurality of first floating diffusion (FD) regions each coupled to at least one of the plurality of imaging pixels, and disposed at a center portion of one of the first pixel groups;
- a plurality of second floating diffusion (FD) regions each coupled to at least one of the plurality of imaging pixels, and disposed at a center portion of one of the second pixel groups; and
- a sensing node structured to connect at least one of the first floating diffusion regions and structured to connect at least one of the second floating diffusion regions, wherein:
each of the first pixel groups includes four imaging pixels arranged in a 2×2 matrix array, and at least one of the four imaging pixels included in the first pixel groups is in a different color from others;
each of the second pixel groups includes four imaging pixels arranged in a 2×2 matrix array, and all the four imaging pixels included in the second pixel groups are in the same color, and
at least one of the first floating diffusion (FD) regions and the second floating diffusion (FD) regions is coupled to the sensing node by a dual conversion gain transistor.

20. The image sensing device according to claim 19, wherein a corresponding first pixel group and a corresponding second pixel group are diagonally arranged with respect to the imaging pixel belonging to both the corresponding first and second pixel groups.

21. The image sensing device according to claim 19, wherein:
the dual conversion gain transistor is coupled to a corresponding first floating diffusion (FD) region through a first terminal of the dual conversion gain transistor, and is coupled to the sensing node through a second terminal of the dual conversion gain transistor;
when photocharges temporarily stored in the corresponding first floating diffusion (FD) region are transferred to the sensing node, the dual conversion gain transistor is activated; and
when photocharges temporarily stored in a corresponding second floating diffusion (FD) region are transferred to the sensing node, the dual conversion gain transistor is selectively activated according to a degree of noise.

22. The image sensing device according to claim 19, wherein:
the dual conversion gain transistor is coupled to a corresponding second floating diffusion (FD) region through a first terminal of the dual conversion gain transistor, and is coupled to the sensing node through a second terminal of the dual conversion gain transistor;
when photocharges temporarily stored in the corresponding second floating diffusion (FD) region are transferred to the sensing node, the dual conversion gain transistor is activated; and
when photocharges temporarily stored in a corresponding first floating diffusion (FD) region are transferred to the sensing node, the dual conversion gain transistor is selectively activated according to an intensity of light received by the imaging pixel.

* * * * *